United States Patent
Konno et al.

(10) Patent No.: US 7,569,866 B2
(45) Date of Patent: *Aug. 4, 2009

(54) SEMICONDUCTOR LIGHT-EMITTING DEVICE

(75) Inventors: Taichiroo Konno, Tsuchiura (JP);
Kazuyuki Iizuka, Tsuchiura (JP);
Masahiro Arai, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 355 days.

This patent is subject to a terminal disclaimer.

(21) Appl. No.: 11/497,379

(22) Filed: Aug. 2, 2006

(65) Prior Publication Data

US 2007/0075321 A1   Apr. 5, 2007

(30) Foreign Application Priority Data

Sep. 30, 2005 (JP) .............................. 2005-285854
Sep. 30, 2005 (JP) .............................. 2005-285896

(51) Int. Cl.
*H01L 33/00* (2006.01)

(52) U.S. Cl. ..................... 257/103; 257/94; 257/101; 257/E33.001

(58) Field of Classification Search .............. 257/94, 257/98, 101, 103
See application file for complete search history.

(56) References Cited

U.S. PATENT DOCUMENTS

| | | | |
|---|---|---|---|
| RE35,665 E | 11/1997 | Lin et al. | |
| 5,856,682 A | 1/1999 | Sasaki | |
| 6,057,562 A | 5/2000 | Lee et al. | |
| 7,230,281 B2 * | 6/2007 | Arai et al. ............ | 257/98 |
| 2005/0145857 A1 | 7/2005 | Maruyama et al. | |
| 2006/0163603 A1 | 7/2006 | Takeuchi et al. | |

FOREIGN PATENT DOCUMENTS

| | | |
|---|---|---|
| JP | 8-83927 A | 3/1996 |
| JP | 08-293623 A | 11/1996 |
| JP | 08-321633 A | 12/1996 |
| JP | 2001-007445 A | 1/2001 |
| JP | 2002-100837 A | 4/2002 |
| JP | 2004-297060 A | 10/2004 |
| JP | 2004-356600 A | 12/2004 |
| JP | 2005-136273 A | 5/2005 |
| JP | 2005-235801 A | 9/2005 |
| JP | 2005-235802 A | 9/2005 |
| JP | 2005-268601 A | 9/2005 |

\* cited by examiner

*Primary Examiner*—Wai-Sing Louie
(74) *Attorney, Agent, or Firm*—Foley & Lardner LLP

(57) ABSTRACT

A semiconductor light-emitting device having: a light-emitting portion formed on a semiconductor substrate, the light-emitting portion having an n-type clad layer, an active layer and a p-type clad layer; an As-based contact layer formed on the light-emitting portion, the contact layer being doped with a p-type dopant of $1\times10^{19}/cm^3$ or more; a current spreading layer formed on the contact layer, the current spreading layer being formed of a transparent conductive film of a metal oxide material; and a buffer layer formed between the contact layer and the p-type clad layer or formed being inserted inside of the p-type clad layer. The buffer layer is of an undoped group III/V semiconductor, and the group III/V semiconductor is of a group V element having P (phosphorus) as a main component thereof.

52 Claims, 12 Drawing Sheets

※ C conc. $5 \times 10^{16}$ atoms/cm³ or less
(NON-DOPED P-BASED BUFFER LAYER)

SEMICONDUCTOR LIGHT-EMITTING DEVICE

The present application is based on Japanese patent application Nos. 2005-285854 and 2005-285896, the entire contents of which are incorporated herein by reference.

BACKGROUND OF THE INVENTION

1. Field of the Invention

This invention relates to a semiconductor light-emitting device and, more particularly, to a high-brightness semiconductor light-emitting device that has a transparent conductive film as a current spreading layer.

2. Description of the Related Art

In recent years, the crystalline quality of GaN-based or AlGaInP-based semiconductors is enhanced since they can be grown by a MOVPE (metalorganic vapor phase epitaxy) method. Thus, a high-brightness blue, green, orange, yellow, and red light-emitting diode (herein referred to as LED) as a semiconductor light-emitting device can be now manufactured.

However, in order to achieve the high brightness, the current spreading property needs to be improved such that an applied current is uniformly supplied into a chip plane of an LED. For example, an AlGaInP-based LED device is fabricated such that the current spreading layer has a large thickness of about 5 to 10 μm. Therefore, the cost of materials required for the growth of the current spreading layer increases, which causes an increase in the manufacturing cost of the LED device. Thus, the AlGaInP-based LED device is difficult to fabricate at low cost.

In consideration of this, a method is proposed that an ITO (indium tin oxide) or ZnO (zinc oxide) film is used as the current spreading layer to get a sufficient translucency and good current spreading characteristics (JP-A-8-83927). Further, a method is proposed that an ITO film is directly formed on a p-type clad layer (see U.S. Reissued Pat. No. 35665 and U.S. Pat. No. 6,057,562).

When the ITO film is used as the current spreading layer, the conventional method of increasing the thickness of the semiconductor layer as the current spreading layer to about 5 μm to 10 μm is not necessary, and the formation of the epitaxial layer can be saved by that much. Thus, the high-brightness LED device and the epitaxial wafer for the LED device can be manufactured at low cost.

However, when the ITO film is used as a window layer, a contact resistance is generated between the semiconductor layer and the ITO film of a metal oxide, and a forward voltage disadvantageously increases. More specifically, the ITO film used as a transparent conductive film (transparent electrode) is an n-type semiconductor. On the other hand, the upper clad layer contacting the ITO film is a p-type semiconductor. Therefore, when a forward voltage is applied to the LED, a reverse bias is established between the transparent conductive film (transparent electrode) and the p-type clad layer. Because of this, a large voltage (i.e., increased operating voltage) has to be applied to flow current therethrough.

To solve this problem, a method is proposed that a p-type contact layer is formed between the p-type clad layer and the ITO film to offer a tunnel junction which allows the LED to be driven at a low voltage (U.S. Reissue Pat. No. 35665). In order to drive the LED at a low voltage by the tunnel junction, the p-type contact layer is composed of an As-based high-carrier concentration layer that a p-type dopant such as Zn is generally doped at a high density of $1\times10^{19}/cm^3$ or more.

The contact layer needs to be formed of a thin film since it can be a light-absorbing layer to light emitted from the active layer. Further, it needs to have a high carrier concentration to achieve the tunnel junction. Therefore, the dopant diffusion is likely to occur due to heat generated during the growth. Especially, in case of forming the high-carrier concentration contact layer on the p-type clad layer, the distance between the contact layer and active layer becomes short so that the diffusion is increased. As a result, the following problems will occur.

The p-type dopant is diffused from the contact layer to the depth direction of the LED device. When the dopant reaches the active layer of the LED device, the dopant causes a defect in the active layer. The defect will compose a nonradiative recombination component to lower the optical output of the LED device.

Further, since a substantial carrier concentration of the high-carrier concentration contact layer lowers due to the dopant diffusion, the tunnel junction is difficult to obtain and the tunnel voltage is increased. For this reason, the drive voltage (forward voltage) of the LED device disadvantageously increases.

In the above method of forming directly the high-carrier concentration layer on the p-type clad layer and forming the ITO film thereon, the dopant is likely to reach the active layer due to the thin p-type clad layer, whereby the optical output lowers and the reliability degrades.

Further, due to the thin p-type clad layer, the device is frequently broken by damage in wire bonding.

As a solution to solve the problems, it is effective to provide a buffer layer to suppress the diffusion of the p-type dopant, Zn between the high-carrier concentration contact layer and the p-type clad layer. The buffer layer is suitably made of AlGaAs or AlAs. This is because these materials are optically transparent to emission wavelength, their crystals are easy to growth as compared to four-element material such as AlGaInP-based materials, and they are almost lattice-match to the AlGaInP-based material to compose the active layer to lower the operating voltage of the LED device. For example, a method of forming the buffer layer is proposed that an AlGaAs layer with a lower resistivity than the p-type clad layer is formed to increase the distance between the active layer and the contact layer (U.S. Pat. No. 6,057,562).

However, the diffusion may be contrary promoted since the buffer layer is doped with a quantity of the dopant so as to allow the buffer layer to have a lower resistivity than the p-type clad layer. Especially, the diffusion can be pronounced when the buffer layer is composed of a semiconductor material containing As as a group V element and transparent to the emission wavelength, e.g., AlGaAs with a high Al ratio in mixed crystal.

Further, when the p-type clad layer has a high C (carbon)-concentration, the diffusion of the dopant becomes much more pronounced. Therefore, the optical output and the reliability lower or degrade significantly. This problem cannot be so much solved even if the distance between the contact layer and the active layer is increased.

On the other hand, it is found by the inventors that the dopant diffusion is further caused by that the buffer layer or p-type clad layer contacting the contact layer has a high H (hydrogen)-concentration, i.e., the dopant diffusion is pronounced as the H-concentration is increased, thereby causing a reduction in optical output and an increase in operating voltage.

SUMMARY OF THE INVENTION

It is an object of the invention to provide a semiconductor light-emitting device that can prevent the diffusion of dopant to achieve a high brightness and a low operating voltage while preventing the breaking of the device in wire bonding process.

(1) According to one aspect of the invention, a semiconductor light-emitting device comprises:

a light-emitting portion formed on a semiconductor substrate, the light-emitting portion comprising an n-type clad layer, an active layer and a p-type clad layer;

an As-based contact layer formed on the light-emitting portion, the contact layer being doped with a p-type dopant of $1 \times 10^{19}/cm^3$ or more;

a current spreading layer formed on the contact layer, the current spreading layer comprising a transparent conductive film of a metal oxide material; and a buffer layer formed between the contact layer and the p-type clad layer or formed being inserted inside of the p-type clad layer, wherein the buffer layer comprises an undoped group III/V semiconductor, and the group III/V semiconductor comprises a group V element comprising P (phosphorus) as a main component thereof.

The group III/V semiconductor comprising a group V element comprising P as a main component thereof can be AlInP, AlGaInP, GaP etc.

Herein, "undoped" or "non-doped" means that a doping is not conducted positively, intentionally or purposely, and it does not exclude the case that an impurity such as C (carbon) is unavoidably mixed in a crystal.

In the above invention (1), the following modifications and changes (i) to (xxiv) can be made.

(i) The buffer layer is lattice-matched to the semiconductor substrate.

(ii) An Al composition of the buffer layer is smaller than that of the p-type clad layer.

The buffer layer may comprises a group III/V semiconductor that is lattice-matched to the semiconductor substrate, without using a lattice-mismatching and wide-bandgap material such as GaP which belongs a P-based material as well. Thereby, the initial operating voltage can be reduced. For example, the group III/V semiconductor to meet the requirements can be AlGaInP or AlInP.

(iii) The semiconductor light-emitting device further comprises: an undoped layer formed between the active layer and the p-type clad layer.

(iv) The buffer layer comprises a C-concentration of $1 \times 10^{17}$ atoms/$cm^3$ or less.

(v) The semiconductor light-emitting device further comprises: an undoped layer formed between the n-type clad layer and the active layer.

(vi) The semiconductor light-emitting device further comprises: an n-type low-doped layer formed between the n-type clad layer and the active layer, wherein the n-type low-doped layer comprises a lower carrier density than the n-type clad layer.

(vii) The current spreading layer comprises an ITO (indium tin oxide).

(viii) The current spreading layer comprises a thickness in a range of ±30% of d calculated by: $d = A \times \lambda_P/(4 \times n)$ where A is a constant of 1 or 3, $\lambda_P$ is an emission wavelength (nm) and n is a refractive index.

(ix) The contact layer comprises Zn as a main dopant thereof, the contact layer comprises a carrier concentration of $1 \times 10^{19}/cm^3$ or more, and the contact layer comprises $Al_XGa_{1-X}As$ where $0 \leq X \leq 0.4$.

(x) The p-type clad layer contains the Mg as a dopant thereof, and the n-type clad layer, the active layer and the p-type clad layer comprise $(Al_XGa_{1-X})_YIn_{1-Y}P$ where $0 \leq X \leq 1$ and $0.4 \leq Y \leq 0.6$.

The p-dopant can be Mg or Zn. Although Zn is well known as a p-dopant for AlGaInP-based compound semiconductor, it is also known that its diffusion constant is relatively large so that it is likely to be badly affected by a thermal process. Therefore, when the carrier concentration of the p-type clad layer is increased by doping Zn, the Zn may be diffused into the active layer to deteriorate the characteristics of the LED device. Thus, it is advantageous to provide the p-type clad layer with a high carrier concentration by using Mg whose diffusion constant is smaller than Zn.

It is preferred that the n-type clad layer, the active layer and the p-type clad layer comprise $(Al_XGa_{1-X})_YIn_{1-Y}P$ where $0 \leq X \leq 1$ and $0.4 \leq Y \leq 0.6$. The reason for selecting these materials is that they are almost lattice-matched to the GaAs substrate and optically transparent to a wavelength of light emitted from the LED device.

(xi) The semiconductor light-emitting device further comprises: a light reflecting layer formed between the semiconductor substrate and the n-type clad layer, wherein the light reflecting layer comprises a semiconductor multilayer comprising 15 pairs or more of two semiconductor layers that are different in refractive index.

(xii) The current spreading layer comprises a carrier concentration of $8 \times 10^{20}/cm^3$ or more.

(xiii) The active layer comprises a multiquantum well structure or strained multiquantum well structure.

(xiv) The p-type clad layer and the buffer layer comprise a summed thickness of 1000 nm or more and 3000 nm or less, and the p-type clad layer comprises a thickness of 200 nm or more and 600 nm or less.

(xv) The contact layer comprises a thickness of 1 nm or more and 30 nm or less.

(xvi) The buffer layer comprises an AlInP or AlGaInP that is optically transparent to an emission wavelength.

(xvii) The light reflecting layer comprises a combination of $(Al_XGa_{1-X})_YIn_{1-Y}P$ where $0 \leq X \leq 1$ and $0.4 \leq Y \leq 0.6$ and $Al_XGa_{1-X}As$ where $0 \leq X \leq 1$.

The reason for selecting these materials is that they are almost lattice-matched to the GaAs substrate and optically transparent to a wavelength of light emitted from the LED device.

As well known, as a difference in refractive index between of two types of materials to compose a DBR (Distributed Bragg Reflector) as a light-reflecting layer is increased, the reflection wavelength band can be widened and the reflectance can be enhanced. Therefore, the above materials can be preferably selected.

(xviii) The semiconductor light-emitting device further comprises: a p-type low-doped layer formed between the active layer and the p-type clad layer, wherein the p-type low-doped layer comprises a lower carrier density than the p-type clad layer.

(xix) The undoped layer comprises a thickness of 100 nm or less.

(xx) The n-type low-doped layer comprises a thickness of 100 nm or less.

(xxi) The p-type low-doped layer comprises a thickness of 100 nm or less.

If the thickness of the undoped layer or low-doped layer contacting the active layer is too large, the supply of carrier to the active layer degrades, the optical output lowers and the fabrication cost increases. Thus, it is desirably 100 nm or less.

(xxii) The semiconductor light-emitting device further comprises: a n-type buffer layer formed on the semiconductor substrate, wherein the n-type buffer layer comprises a same material as the semiconductor substrate.

(xxiii) The buffer layer comprises a lattice-mismatching ratio to a semiconductor layer formed thereunder, and the lattice-mismatching ratio comprises an absolute value of 0.3% or less.

(xxiv) The buffer layer comprises a GaP.

(2) According to one aspect of the invention, a semiconductor light-emitting device comprises:

a light-emitting portion formed on a semiconductor substrate, the light-emitting portion comprising an n-type clad layer, an active layer and a p-type clad layer;

an As-based contact layer formed on the light-emitting portion, the contact layer being doped with a p-type dopant of $1 \times 10^{19}/cm^3$ or more;

a current spreading layer formed on the contact layer, the current spreading layer comprising a transparent conductive film of a metal oxide material; and a buffer layer formed between the contact layer and the p-type clad layer or formed being inserted inside of the p-type clad layer, wherein the buffer layer comprises an undoped group III/V semiconductor, the group III/V semiconductor comprises a group V element comprising P (phosphorus), and the group III/V semiconductor comprises an H-concentration of $3 \times 10^{17}$ atoms/cm$^3$ or less.

The group III/V semiconductor comprising a group V element comprising P as a main component thereof can be AlInP, AlGaInP, GaP etc.

Further, the buffer layer is set to have an H-concentration of $3 \times 10^{17}$ atoms/cm$^3$ or less. This is because a high H-concentration may cause an increase in p-dopant diffused so that the optical output is reduced and the operating voltage is increased.

In the above invention (2), the following modifications and changes (xxv) to (xxxxviii) can be made.

(xxv) The buffer layer is lattice-matched to the semiconductor substrate, and the buffer layer comprises the group III/V semiconductor with a higher resistivity than the p-type clad layer.

(xxvi) An Al composition of the buffer layer is smaller than the p-type clad layer.

(xxvii) The semiconductor light-emitting device further comprises: an undoped layer formed between the active layer and the p-type clad layer.

(xxviii) The buffer layer comprises a C-concentration of $5 \times 10^{16}$ atoms/cm$^3$ or less.

The reason why the C-concentration is reduced as well as the H-concentration, the Zn diffusion from the contact layer depends on the C-concentration. Namely, as the C-concentration increases, the Zn diffusion is increased so that the optical output lowers and the operating voltage increases. From this viewpoint, the buffer layer comprises preferably a C-concentration of $5 \times 10^{16}$ atoms/cm$^3$ or less.

(xxix) The semiconductor light-emitting device further comprises: an undoped layer formed between the n-type clad layer and the active layer.

(xxx) The semiconductor light-emitting device further comprises: an n-type low-doped layer formed between the n-type clad layer and the active layer, wherein the n-type low-doped layer comprises a semiconductor comprising a n-type conductivity-determining impurity with a lower concentration than the n-type clad layer.

(xxxi) The current spreading layer comprises an ITO (indium tin oxide).

(xxxii) The current spreading layer comprises a thickness in a range of ±30% of d calculated by: $d = A \times \lambda_P/(4 \times n)$ where A is a constant of 1 or 3, $\lambda_P$ is an emission wavelength (nm) and n is a refractive index.

(xxxiii) The contact layer comprises Zn as a dopant thereof, the contact layer comprises a carrier concentration of $1 \times 10^{19}/cm^3$ or more, and the contact layer comprises $Al_XGa_{1-X}As$ where $0 \leq X \leq 0.4$.

Materials capable of stably offering a high carrier concentration of $1 \times 10^{19}/cm^3$ or more are limited. The optimum material can be $Al_XGa_{1-X}As$ where $0 \leq X \leq 0.4$. However, it needs to have a thickness of 30 nm or less since the AlGaAs is not transparent to the emission wavelength.

(xxxiv) The p-type clad layer comprises Mg as a dopant thereof, and the n-type clad layer, the active layer and the p-type clad layer comprise comprises $(Al_XGa_{1-X})_YIn_{1-Y}P$ where $0 \leq X \leq 1$ and $0.4 \leq Y \leq 0.6$.

The p-dopant can be Mg or Zn. Although Zn is well known as a p-dopant for AlGaInP-based compound semiconductor, it is also known that its diffusion constant is relatively large so that it is likely to be badly affected by a thermal process. Therefore, when the carrier concentration of the p-type clad layer is increased by doping Zn, the Zn may be diffused into the active layer to deteriorate the characteristics of the LED device. Thus, it is advantageous to provide the p-type clad layer with a high carrier concentration by using Mg whose diffusion constant is smaller than Zn.

It is preferred that the n-type clad layer, the active layer and the p-type clad layer comprise $(Al_XGa_{1-X})_YIn_{1-Y}P$ where $0 \leq X \leq 1$ and $0.4 \leq Y \leq 0.6$. The reason for selecting these materials is that they are almost lattice-matched to the GaAs substrate and optically transparent to a wavelength of light emitted from the LED device.

(xxxv) The semiconductor light-emitting device further comprises: a light reflecting layer formed between the semiconductor substrate and the n-type clad layer, wherein the light reflecting layer comprises a semiconductor multilayer comprising 10 pairs or more of two semiconductor layers that are different in refractive index.

(xxxvi) The current spreading layer comprises a carrier concentration of $8 \times 10^{20}/cm^3$ or more.

(xxxvii) The active layer comprises a multiquantum well structure or strained multiquantum well structure.

(xxxviii) The p-type clad layer and the buffer layer comprise a summed thickness of 1000 nm or more and 3000 nm or less, and the p-type clad layer comprises a thickness of 200 nm or more and 1000 nm or less.

(xxxix) The contact layer comprises a thickness of 1 nm or more and 30 nm or less.

(xxxx) The buffer layer comprises an AlInP or AlGaInP that is optically transparent to an emission wavelength.

(xxxxi) The light reflecting layer comprises a combination of $(Al_XGa_{1-X})_YIn_{1-Y}P$ where $0 \leq X \leq 1$ and $0.4 \leq Y \leq 0.6$ and $Al_XGa_{1-X}As$ where $0 \leq X \leq 1$.

(xxxxii) The semiconductor light-emitting device further comprises: a p-type low-doped layer formed between the active layer and the p-type clad layer, wherein the p-type low-doped layer comprises a semiconductor comprising a p-type conductivity-determining impurity with a lower concentration than the p-type clad layer.

(xxxiii) The undoped layer comprises a thickness of 100 nm or less.

(xxxiv) The n-type low-doped layer comprises a thickness of 100 nm or less.

(xxxxv) The p-type low-doped layer comprises a thickness of 100 nm or less.

(xxxxvi) The semiconductor light-emitting device further comprises: a n-type buffer layer formed on the semiconductor substrate, wherein the n-type buffer layer comprises a same material as the semiconductor substrate.

(xxxxvii) The buffer layer comprises a lattice-mismatching ratio to a semiconductor layer formed thereunder, and the lattice-mismatching ratio comprises an absolute value of 0.3% or less.

Herein, lattice-mismatch ratio is obtained by: lattice-mismatch ratio=$(a_{epitaxial\ layer} - a_{substrate})/a_{substrate}$ where $a_{epitaxial\ layer}$ means a lattice constant of an epitaxial layer, and $a_{substrate}$ means a lattice constant of a substrate.

(xxxxviii) The buffer layer comprises a GaP.

DESCRIPTION OF THE PREFERRED EMBODIMENTS

Figure 1:
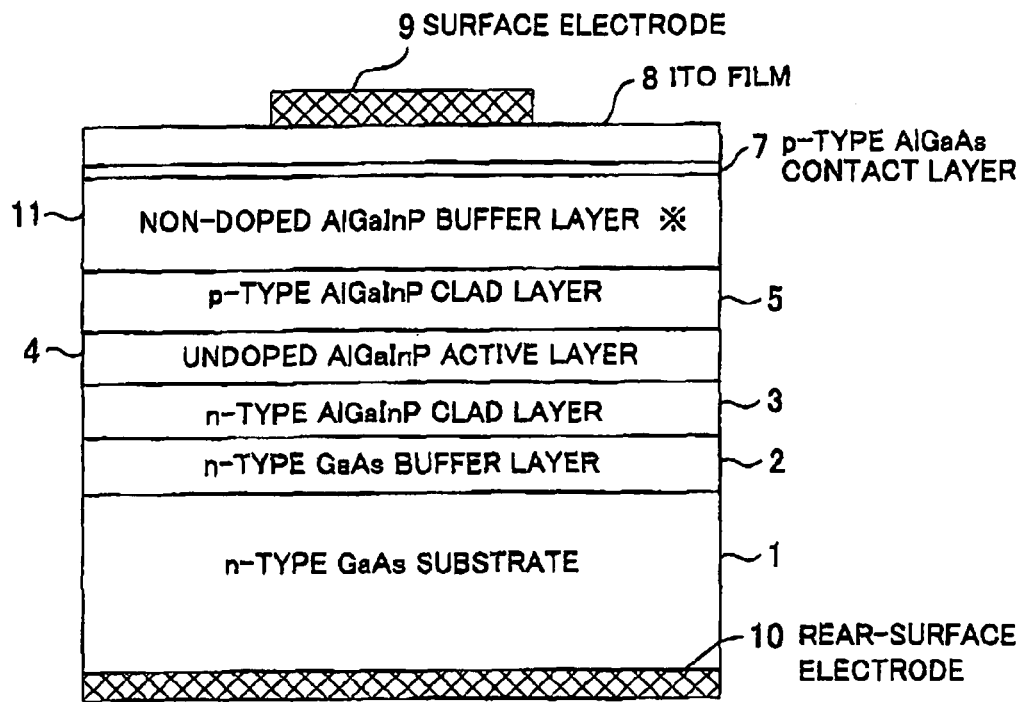
FIG. 1 is a schematic cross sectional view showing an AlGaInP-based red LED in a preferred embodiment of the invention and in Example 1 of the invention.

FIG. 1 shows the structure of a light-emitting diode in the preferred embodiment of the invention.

The light-emitting diode comprises, sequentially grown on an n-type GaAs substrate 1 which is a semiconductor substrate, an n-type GaAs buffer layer 2, an n-type AlGaInP clad layer (also referred to simply as n-type clad layer) 3, an undoped AlGaInP active layer 4, and a p-type AlGaInP clad layer (also referred to simply as p-type clad layer) 5, which compose a light-emitting portion.

On the uppermost layer of the light-emitting portion, i.e., the p-type clad layer 5, a non-doped AlGaInP buffer layer 11 and a p-type AlGaAs contact layer (also referred to simply as p-type contact layer) 7 added with a p-type dopant at a high density are stacked. Furthermore, on the p-type contact layer 7, an ITO film 8 which is a transparent conductive film is stacked as a current spreading layer of a metal oxide material. A surface electrode 9 is formed on the top, and a rear-surface electrode 10 is formed on the rear surface of the n-type GaAs substrate 1.

The active layer 4 comprises $(Al_xGa_{1-x})_YIn_{1-Y}P$ ($0 \leq X \leq 1$ and $0.4 \leq Y \leq 0.6$), and the p-type clad layer 5 has a composition of $(Al_xGa_{1-x})_YIn_{1-Y}P$ ($0.6 \leq X \leq 1$ and $0.4 \leq Y \leq 0.6$). The n-type clad layer 3 contains a dopant, Si, and the p-type clad layer 5 contains a dopant, Mg.

The p-type contact layer 7 comprises $Al_xGa_{1-x}As$ ($0 \leq X \leq 0.4$), which has a thickness of 1 nm or more and 30 nm or less, and which is doped with Zn at a high density of $1 \times 10^{19}/cm^3$ or more.

Figure 9:
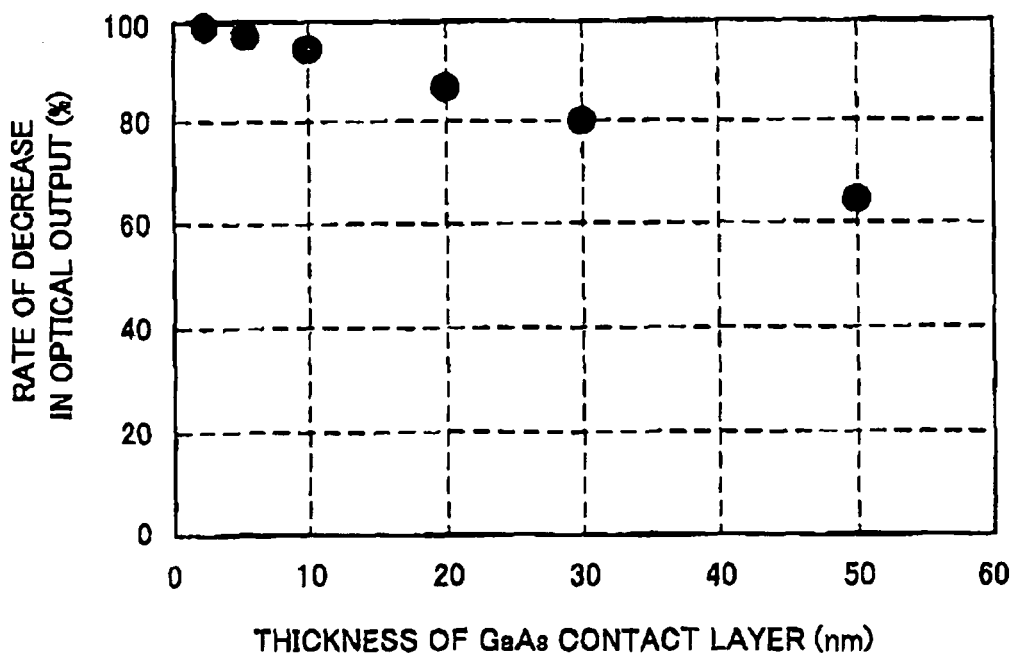
FIG. 9 is a graph showing relationships between a thickness of a contact layer and a rate of decrease in optical output.

Since the contact layer 7 has a bandgap to absorb light emitted from the active layer 4, the optical output lowers as the thickness thereof increases. FIG. 9 is a graph showing relationships between a thickness of the contact layer 7 and a rate of decrease in optical output. As shown in FIG. 9, the upper limit of the thickness of the contact layer 7 is preferably 30 nm, more preferably 25 nm. If the thickness of the contact layer 7 is less than 1 nm, it is difficult to have the tunnel junction between the ITO film 8 and the contact layer 7. Therefore, the operating voltage is difficult to lower and stabilize. Accordingly, it is preferred that the contact layer 7 contacting the ITO film 8 has a thickness of 1 to 30 nm.

Further, the contact layer 7 contacting the ITO film 8 needs to be doped with very high concentration conductivity-determining impurity. For example, in the case of the contact layer 7 with Zn doped thereinto, it is desired that the Al ratio of the mixed crystal material is from zero, i.e., GaAs, to 0.4, i.e., $Al_{0.4}Ga_{0.6}As$. The carrier concentration is desirably $1 \times 10^{19}/cm^3$ or more, which is preferred as high as possible.

The ITO film 8 belongs basically to n-type semiconductor. The LED is generally fabricated p-side up. Thus, the LED using the ITO film 8 as the current spreading layer has, in conductivity type, a junction of n/p/n viewing from the substrate side. Therefore, the LED has a large potential barrier generated at the interface between the ITO film 8 and the p-type semiconductor layer, and the LED must have generally a very high operating voltage. To solve this problem, the contact layer 7 needs to be a p-type semiconductor layer with a very high carrier concentration. The reason why the contact layer 7 has a narrow bandgap is that the high carrier concentration can be facilitated by such a narrow bandgap.

The ITO film 8 as the current spreading layer is formed by a vacuum deposition method or a sputtering method. In connection with the high carrier concentration of the contact layer 7, it is important that the ITO film 8 contacting the contact layer 7 has a high carrier concentration. For the same reason as the contact layer 7, it is preferred that its carrier concentration is as high as possible. The ITO film 8 has preferably a carrier concentration of $8\times10^{20}/cm^3$ or more just after the film formation.

The film thickness of the ITO film 8 as the current spreading layer is in a range of ±30% of d calculated by a relational expression of $d=A\times\lambda_P/(4\times n)$, where A is a constant (A=1 or 3), $\lambda_P$ is an emission wavelength (nm), and n is a refractive index.

The ITO film 8 formed on the LED epitaxial wafer has a refractive index nearly in the middle of the semiconductor layer and the air layer, and it functions optically as a reflection preventing film. Depending on the formation method or film quality of the ITO film 8, as the ITO film 8 increases in thickness, the transmissivity may degrade and the optical output may lower. Further, since the optical interference increases in the current spreading layer, wavelength region with high light extraction efficiency may be narrowed. Thus, in order to increase the light extraction efficiency to enhance the optical output of the LED device, it is preferred that it has a thickness according to the above relational expression. In the expression, the constant A is preferably 1 or 3. The ITO film 8 has desirably a thickness in the range of ±30% of d calculated by the relational expression so as to keep the effect of the reflection preventing film. This is because a wavelength band with an optically low reflectivity to serve as a reflection preventing film has a certain width. For example, tolerance in thickness of a reflection preventing film to have a reflectivity of 15% or less is in the range of ±30% of d calculated by the relational expression. If d exceeds ±30%, the effect of the reflection preventing film lowers and the optical output of the LED device lowers.

A feature of the light-emitting diode is that the non-doped buffer layer 11 that is formed between the p-type contact layer 7 and the p-type clad layer 5, and comprises a group III/V semiconductor that comprises P (phosphorus) as a main group V element, being lattice-matched to the semiconductor substrate 1 and being undoped.

The non-doped buffer layer 11 is preferably composed of a group III/V semiconductor whose crystal is lattice-matched to the semiconductor substrate, without using a lattice-mismatched wide-bandgap material such as GaP, P-based material. A representative of the group III/V semiconductor comprising P (phosphorus) as a main group V element can be AlInP, AlGaInP, GaP etc. which are optically transparent to the emission wavelength and lattice-matched to the substrate. Thereby, the initial operating voltage can be reduced.

It is preferred that C-concentration of the buffer layer 11 is reduced to $1\times10^{17}$ atoms/cm³ or less. This is because Zn diffusion from the contact layer 7 varies depending on C-concentration, i.e., when the C-concentration increases, the Zn diffusion is increased to cause a decrease in the optical output. Although the non-doped buffer layer 11 is not doped with any dopant positively, even when C (carbon) is unavoidably added thereto, the C-concentration is suppressed to be $1\times10^{17}$ atoms/cm³ or less.

The thickness of the buffer layer 11 is set such that a sum of the thicknesses (in general, 200 nm to 600 nm) of the buffer layer 11 and the p-type clad layer 5 falls within a range of 1000 nm to 3000 nm. Namely, the thickness of the buffer layer 11 is set within a range of about 400 nm to 2800 nm. The thickness is suited to obtain a structure which can prevent a device from being broken in a wire bonding step.

The reason why the thickness of the buffer layer 11 is set 400 nm or more is that, if the distance from the active layer 4 to the surface electrode 9 is too short, the LED device may be broken by ultrasonic vibration etc. in the wire bonding process of the LED device fabrication. On the other hand, the reason why the upper limit is set 2800 nm or less is that the current spreading property of the LED device can be sufficiently obtained by the ITO film 8 formed on the contact layer 7. If the buffer layer 11 is thickened about 10 μm, the optical output of the LED device cannot be enhanced significantly since the current spreading effect of the ITO film 8 as described earlier is predominant. On the contrary, the fabrication cost of the LED device will be increased and the LED device must be thus increased in production cost. Accordingly, it is preferred that the buffer layer 11 has a thickness of about 400 to 2800 nm, since the p-type clad layer 5 has generally a thickness of 200 to 600 nm.

In this invention, the buffer layer 11 may have the same composition as the p-type clad layer 5. Even in this case, it is preferred that the distance from the upper end of the active layer 4 to the lower end of the contact layer 7 is 1000 nm or more and 3000 nm or less.

As described, since the buffer layer 11 is non-doped and has a reduced C-concentration, the Zn diffusion from the contact layer 7 can be suppressed effectively. Further, since the non-doped buffer layer 11 is composed of AlGaInP or AlInP to contain P as group V element without using an As-based material transparent to the active layer 4 such as AlGaAs with high Al ratio in mixed crystal, excellent initial characteristics and high reliability can be obtained. Further, since it is composed of a AlGaInP or AlInP-based material lattice-matched to the substrate 1, the initial operating voltage can be also reduced.

Accordingly, the semiconductor light-emitting device can be obtained that can prevent a reduction in the optical output and an increase in the operating voltage (i.e., degradation in lifetime characteristic and reduction in reliability) with time.

The invention will be further detailed below in Examples 1-13 and Comparative Examples 1-4.

EXAMPLE 1

Example 1 features the buffer layer 11 composed of non-doped AlGaInP.

In Example 1, a red LED epitaxial wafer with a structure as shown in FIG. 1 and an emission wavelength of about 630 nm is fabricated. Its epitaxial growth method, epitaxial layer thickness, epitaxial layer structure, electrode formation method, and LED device fabrication method will be explained below.

On the n-type GaAs substrate 1, by the MOVPE method, the n-type (Si-doped) GaAs buffer layer 2 (with a thickness of 200 nm and a carrier concentration of $1\times10^{18}/cm^3$), the n-type (Si-doped) $(Al_{0.7}Ga_{0.3})_{0.5}In_{0.5}P$ clad layer 3 (with a thickness of 400 nm and a carrier concentration of $7\times10^{18}/cm^3$), the undoped $(Al_{0.1}Ga_{0.9})_{0.5}In_{0.5}P$ active layer 4 (with a thickness of 600 nm), the p-type (Mg-doped) $(Al_{0.7}Ga_{0.3})_{0.5}In_{0.5}P$ clad layer 5 (with a thickness of 400 nm and a carrier concentration of $1\times10^{19}/cm^3$), the non-doped $(Al_{0.7}Ga_{0.3})_{0.5}In_{0.5}P$ buffer layer 11 (with a thickness of 600 nm), and the p-type (Zn-doped) $Al_{0.1}Ga_{0.9}As$ contact layer 7 (with a thickness of 3 nm and a carrier concentration of $7\times10^{19}/cm^3$) are sequentially grown in lamination.

The growth temperature in the MOVPE growth is set at 650° C. from the n-type GaAs buffer layer 2 to the non-doped $(Al_{0.7}Ga_{0.3})_{0.5}In_{0.5}P$ buffer layer 11 (herein also called simply non-doped buffer layer 11 or buffer layer 11), and the growth temperature of the p-type (Zn-doped) $Al_{0.1}Ga_{0.9}As$ contact layer 7 (herein also called simply p-type contact layer 7) is set at 550° C. The other growth conditions are a growth pressure of about 6666 Pa (50 Torr), a growth rate of the respective layers in the range of 0.3 to 1.0 nm/sec, and a V/III ratio of about 150. However, the non-doped buffer layer 11 has a V/III ratio of 200 so as to reduce the C-concentration. Also, the p-type contact layer 7 has a V/III ratio of 10. Herein, the V/III ratio is a ratio (quotient) obtained by a denominator, which is the number of moles of a group III material such as TMGa or TMAl, and a numerator, which is the number of moles of a group V material such as $AsH_3$ or $PH_3$.

A material used in the MOVPE growth can be an organic metal such as trimethyl gallium (TMGa) or triethyl gallium (TEGa), trimethyl aluminum (TMAl) and trimethyl indium (TMIn), or a hydride gas such as arsine ($AsH_3$) and phosphine ($PH_3$). A dopant material for an n-type layer such as the n-type buffer layer 2 can be disilane ($Si_2H_6$). A dopant material for a conductivity-determining impurity of a p-type layer such as the p-type clad layer 5 (herein also called simply p-type clad layer 5) can be biscyclopentadienyl magnesium ($Cp_2Mg$). However, diethyl zinc (DEZn) is used only for the p-type contact layer 7.

Furthermore, a dopant material for a conductivity-determining impurity of an n-type layer such as the n-type (Si-doped) $(Al_{0.7}Ga_{0.3})_{0.5}In_{0.5}P$ clad layer 3 (herein also called simply n-type clad layer 3) can be also hydrogen selenide ($H_2Se$), monosilane ($SiH_4$), and diethyl tellurium (DETe). A p-type dopant material for the p-type clad layer 5 can be also dimethyl zinc (DMZn) and diethyl zinc (DEZn).

In addition, after the LED epitaxial wafer is taken out from the MOVPE furnace, the ITO film 8 with a thickness of 270 nm is formed by the vacuum deposition method on the surface of the wafer, i.e., the upper surface side of the p-type contact layer 7. In this structure, the ITO film 8 composes the current spreading layer.

At this time, an evaluating glass substrate set in the same batch as for the deposition of the ITO film 8 is taken out and cut into a size enough for the Hall measurement, and the electric characteristics of only the ITO film 8 are evaluated. As a result, a carrier concentration is $1.1\times10^{21}/cm^3$, a mobility is 18 $cm^2/Vs$, and a resistivity is $2.9\times10^{-4}$ $\Omega\cdot cm$.

Then, the surface electrode 9 as a circular electrode and with a diameter of 110 µm is provided in the form of a matrix on the upper surface of the epitaxial wafer by the vacuum deposition method by using tools or materials and process used for a general photolithography process such as a resist and a mask aligner. A liftoff method is used in electrode formation after the deposition. The surface electrode 9 is formed by sequentially depositing Ni (nickel) and Au (gold) with thicknesses of 20 nm and 500 nm, respectively. Furthermore, on the entire bottom surface of the epitaxial wafer, the rear-surface electrode 10 is formed by the same vacuum deposition method. The rear-surface electrode 10 is formed by sequentially depositing AuGe (gold-germanium alloy), Ni (nickel), and Au (gold) with thicknesses of 60 nm, 10 nm, and 500 nm, respectively. Then, an alloy process to alloy the electrode is performed such that the electrode is heated at 400° C. in a nitrogen gas atmosphere for 5 minutes.

Then, the LED epitaxial wafer with the electrode formed as described above is cut by a dicer such that the elliptic surface electrode 9 is located at the center, so as to obtain an LED bear chip with a chip size of 300 µm square. Then, the LED bear chip is mounted (die-bonding) on a TO-18 stem. Then, the LED bear chip is wire-bonded to have the LED device.

Initial characteristics of the LED device thus fabricated are evaluated. As a result, the LED device has excellent initial characteristics, i.e., an optical output of 1.05 mW and an operating voltage of 1.84 V during the power feeding at 20 mA (in evaluation).

Furthermore, a continuous current test for 168 hours (=1 week) is conducted where the LED device is driven at 50 mA in the environment of an atmospheric humidity. As relative values as compared to those before the test, optical output is 102% (provided that optical output before the power feeding is 100%; hereinafter referred to as a relative output), and operation voltage is +0.004 V (about 0.2% increased). In this test, none of the LED devices fabricated are broken. Thus, the product yield is very high.

As described above, since the buffer layer 11 is composed of non-doped and low C-concentration AlGaInP to contain P as a group V element without using an As-based material transparent to the active layer 4 such as AlGaAs with high Al ratio in mixed crystal, it can have excellent initial characteristics and high reliability. Further, since it is composed of AlGaInP-based material lattice-matched to the substrate 1 without using the wide bandgap and lattice-mismatching P-based materials such as GaP, the initial operating voltage can be also reduced.

SIMS analysis is conducted for the LED device just after the formation of the LED device and for the LED device after the continuous current test under the above conditions. As a result, it is confirmed that, in the LED device of Example 1 after the continuous current test, Zn as a dopant of the p-type contact layer 7 is not mixed in the active layer 4 and is rarely diffused from the contact layer 7. Thus, as described in Example 1, the dopant diffusion in the LED device can be suppressed by using the non-doped and low C-concentration AlGaInP buffer layer 11. Further, the LED device can be fabricated without being broken to enhance the product yield.

Meanwhile, in case of the AlGaInP buffer layer 11, the absolute value of a lattice-mismatch ratio to the underlying semiconductor layer is 0.3% or less. Herein, lattice-mismatch ratio is obtained by: lattice-mismatch ratio=$(a_{epitaxial\ layer}-a_{substrate})/a_{substrate}$ where $a_{epitaxial\ layer}$ means a lattice constant of an epitaxial layer, and $a_{substrate}$ means a lattice constant of a substrate.

EXAMPLE 2

Example 2 features that the buffer layer comprises non-doped AlGaInP and the non-doped buffer layer is sandwiched by the clad layers.

Figure 2:
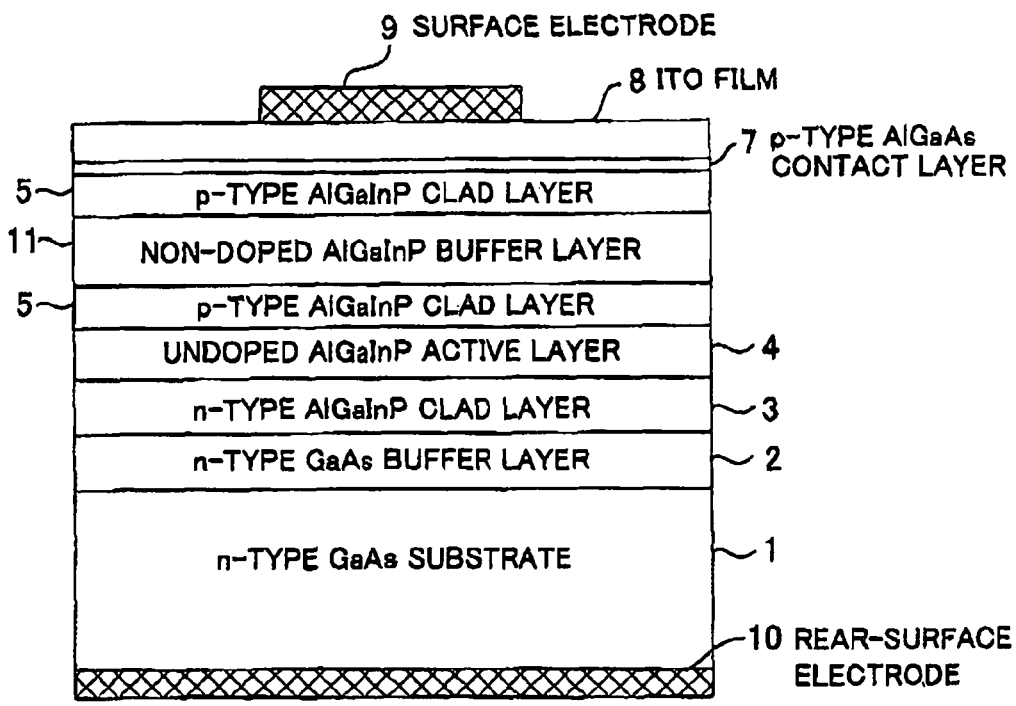
FIG. 2 is a schematic cross sectional view showing an AlGaInP-based red LED in Example 2 of the invention.

In Example 2, a red LED epitaxial wafer with a structure as shown in FIG. 2 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

However, in Example 2, the p-type clad layer 5 has a thickness of 200 nm, and the non-doped $(Al_{0.7}Ga_{0.3})_{0.5}In_{0.5}P$ buffer layer 11 with a thickness of 600 nm is formed thereon, and the same layer as the p-type clad layer 5 with a thickness of 200 nm is formed thereon. In other words, the non-doped $(Al_{0.7}Ga_{0.3})_{0.5}In_{0.5}P$ buffer layer 11 with a thickness of 600 nm is inserted in the p-type clad layer 5.

The LED device has excellent initial characteristics, i.e., an optical output of 1.01 mW and an operating voltage of 1.86 V as well as a high relative output of 99%. Further, the LED device can be fabricated without being broken to enhance the product yield.

EXAMPLE 3

Example 3 features that the buffer layer comprises non-doped AlGaInP and an undoped layer or low-doped layer is formed between the active layer and the clad layer.

Figure 3:
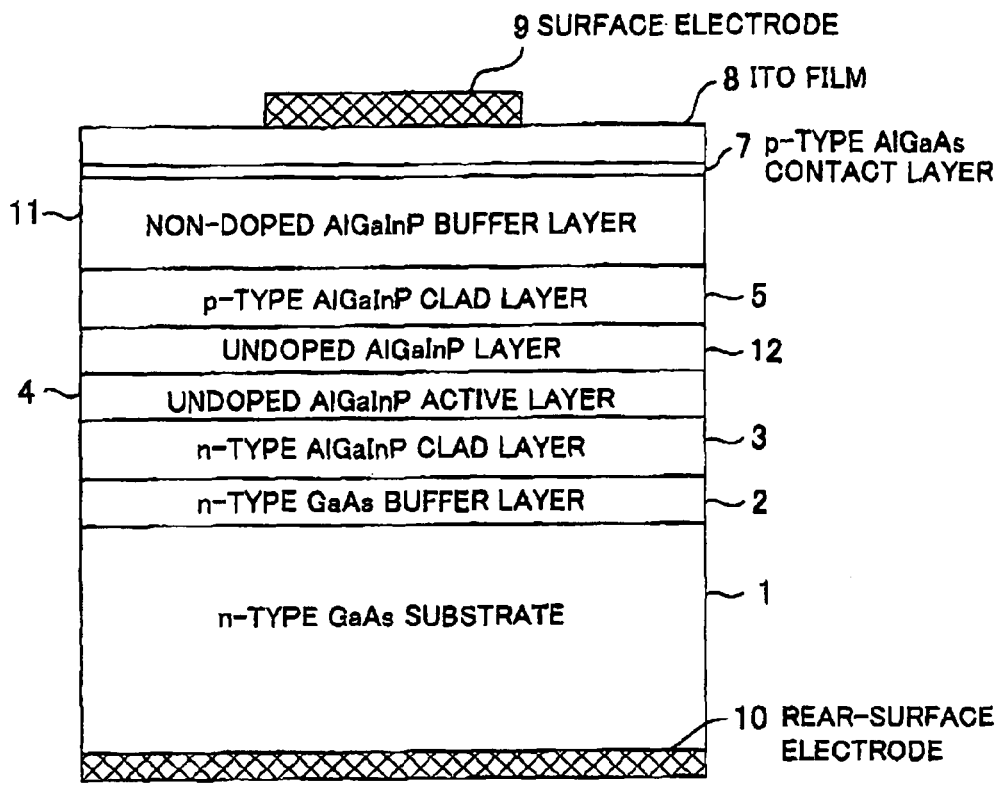
FIG. 3 is a schematic cross sectional view showing an AlGaInP-based red LED in Example 3 of the invention.

In Example 3, a red LED epitaxial wafer with a structure as shown in FIG. 3 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

However, in Example 3, the $(Al_{0.7}Ga_{0.3})_{0.5}In_{0.5}P$ undoped layer 12 with a thickness of 75 nm is formed between the active layer 4 and the p-type clad layer 5.

Figure 4:
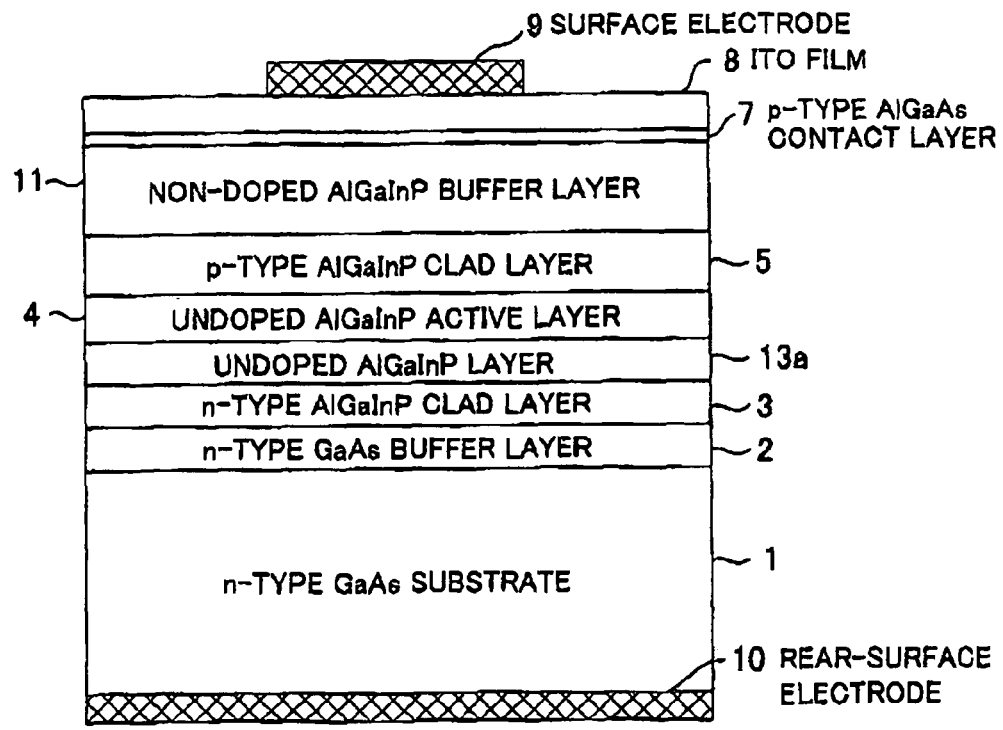
FIG. 4 is a schematic cross sectional view showing a modification of the AlGaInP-based red LED in Example 3 of the invention.

Modifications of Example 3 are an LED as shown in FIG. 4 that a $(Al_{0.7}Ga_{0.3})_{0.5}In_{0.5}P$ undoped layer 13a with a thickness of 75 nm is formed between the n-type clad layer 3 and the active layer 4, and an LED (not shown) that a $(Al_{0.7}Ga_{0.3})_{0.5}In_{0.5}P$ low-doped layer (with Si-doped, a carrier concentration of $2\times10^{17}/cm^3$) with a thickness of 75 nm is formed in place of the undoped layer 13a.

It is desired that the undoped layers 12, 13a and the low-doped layer contacting the active layer 4 have a thickness of 100 nm or less since, if the thickness is too large, the supply of carrier to the active layer 4 degrades, the optical output lowers and the fabrication cost increases.

The three LED devices thus fabricated have excellent initial characteristics, i.e., an optical output of 1.00-1.15 mW and an operating voltage of 1.85-1.86 V as well as a high relative output of 101-105%. Further, the LED device can be fabricated without being broken to enhance the product yield.

EXAMPLE 4

Example 4 features that the buffer layer and the p-type clad layer each comprise AlInP.

Figure 5:
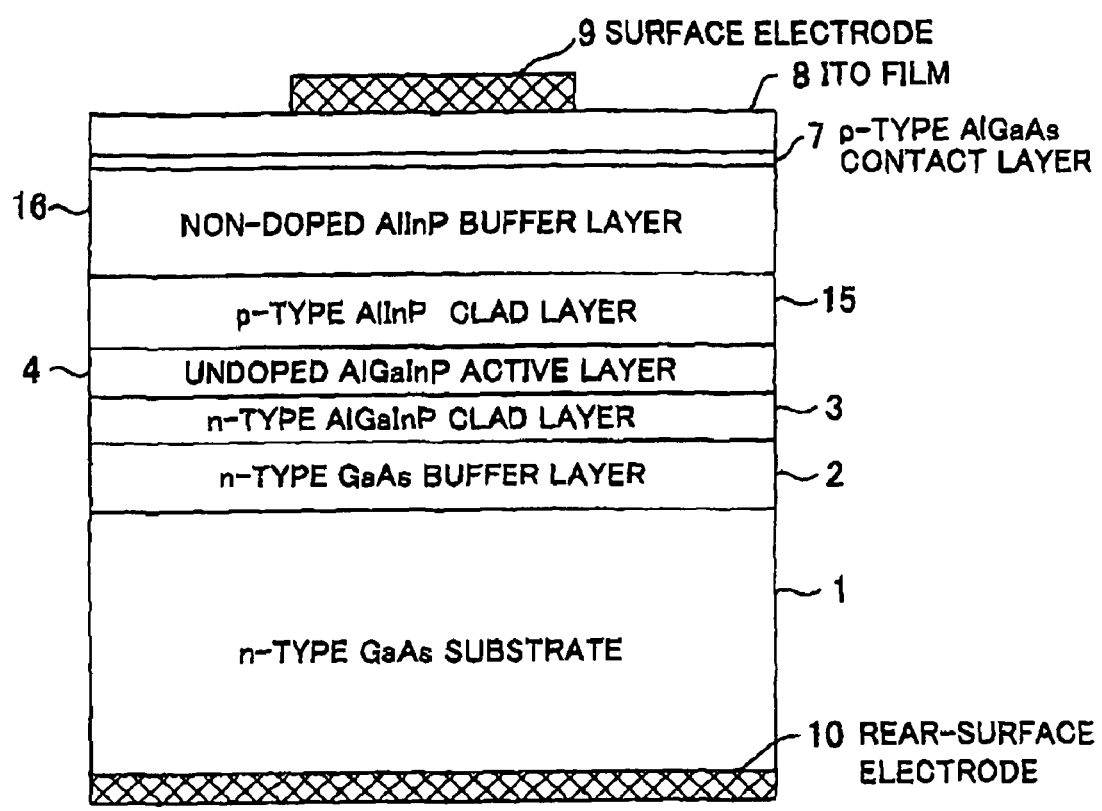
FIG. 5 is a schematic cross sectional view showing an AlGaInP-based red LED in Example 4 of the invention.

In Example 4, a red LED epitaxial wafer with a structure as shown in FIG. 5 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

However, in Example 4, a p-type AlInP clad layer 15 and a non-doped AlInP buffer layer 16 are formed in place of the p-type clad layer 5 and the non-doped and low C-concentration buffer layer 11. They are 400 nm and 600 nm, respectively, in thickness.

A modification of Example 4 is an LED (not shown) that a p-type AlInP clad layer 15 and the non-doped buffer layer 11 are formed in place of layers 15 and 16, respectively.

The two LED devices thus fabricated respectively have excellent initial characteristics, i.e., optical outputs of 1.06 and 1.11 mW and operating voltages of 1.84 and 1.85 V during power feeding at 20 mA (in evaluation).

Further, when the continuous current test is conducted under the same conditions as Example 1, the two LED devices have high relative outputs of 101% and 103%, respectively. Also, the LED device can be fabricated without being broken to enhance the product yield.

EXAMPLE 5

Example 5 features that a DBR (distributed Bragg reflector) is formed.

Figure 6:
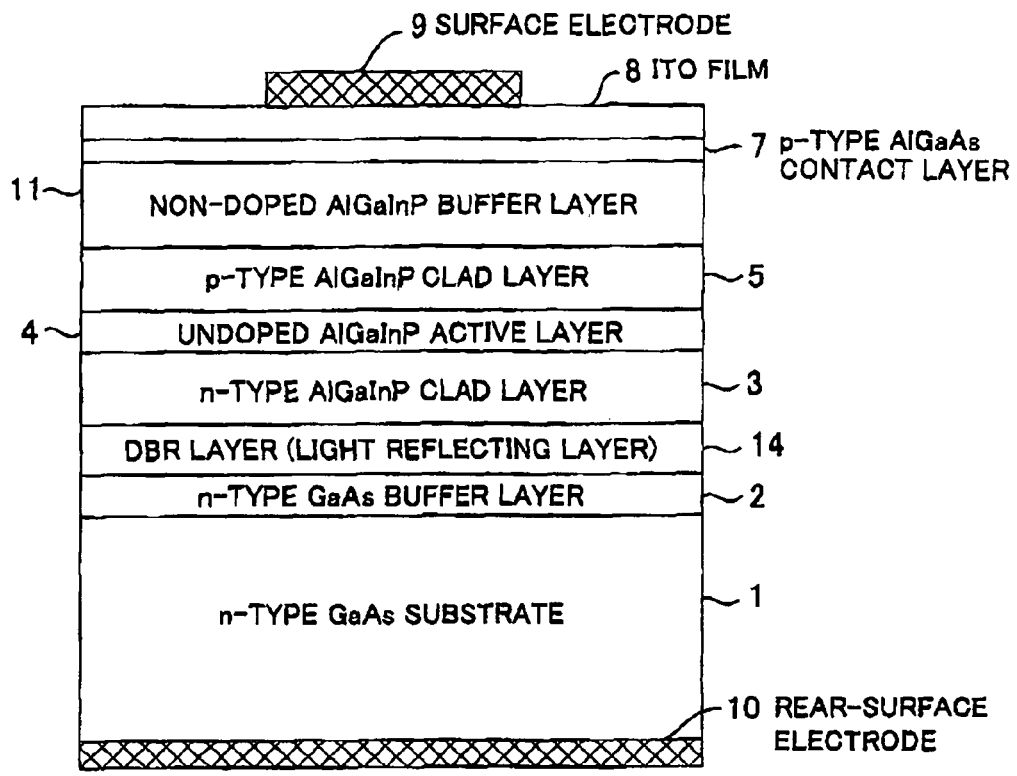
FIG. 6 is a schematic cross sectional view showing an AlGaInP-based red LED in Example 5 of the invention.

In Example 5, a red LED epitaxial wafer with a structure shown in FIG. 6 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

However, in Example 5, a light reflecting layer 14 comprising 15 pairs of DBR where an AlInP layer and an $Al_{0.4}Ga_{0.6}As$ layer, 30 layers in total, are alternately formed between the n-type buffer layer 2 and the n-type clad layer 3. The light reflecting layer 14 has a thickness of $\lambda_P/4n$ and a carrier concentration of about $1\times10^{18}/cm^3$.

It is desired that the light reflecting layer 14 has 10 to 30 pairs of DBR. This is because 10 pairs or more are needed to have a sufficient reflectivity and if exceeds 30 pairs, the optical output is saturated so that any additional effect cannot be expected.

The LED device thus fabricated has excellent initial characteristics, i.e., an optical output of 1.56 mW and an operating voltage of 1.85 V during power feeding at 20 mA (in evaluation).

Further, when the continuous current test is conducted under the same conditions as Example 1, the LED device has a high relative output of 101%. Also, the LED device can be fabricated without being broken to enhance the product yield.

EXAMPLE 6

Example 6 features that a multiquantum well (MQW) is formed.

Figure 7:
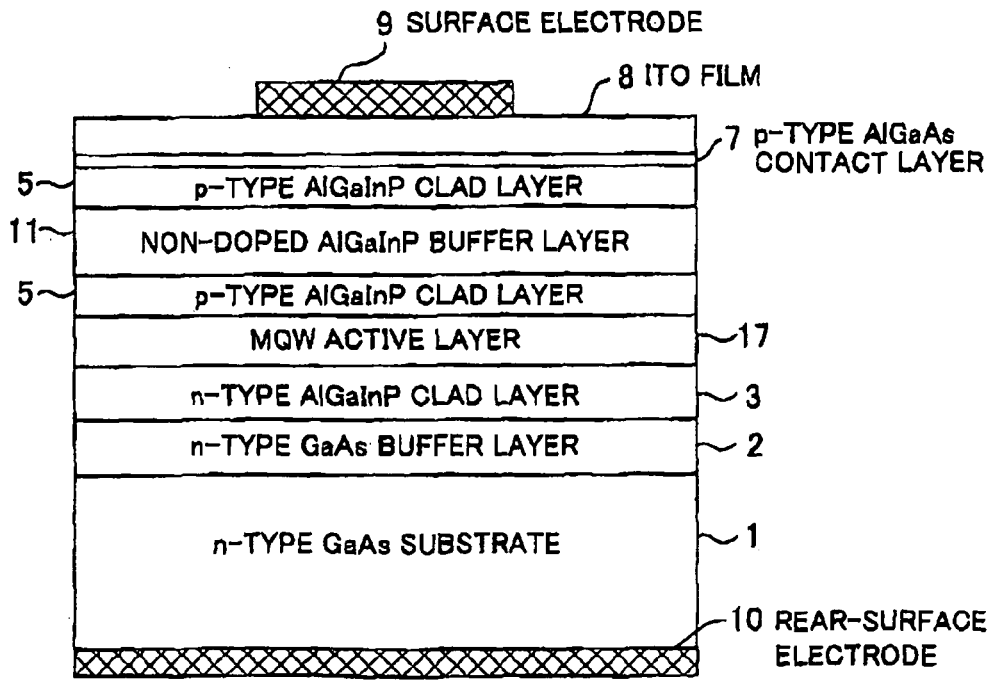
FIG. 7 is a schematic cross sectional view showing an AlGaInP-based red LED in Example 6 of the invention.

In Example 6, a red LED epitaxial wafer with a structure as shown in FIG. 7 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

However, in Example 6, the active layer 4 comprises a MQW active layer 17. The MQW is composed of 40.5 pairs of a $(Al_{0.5}Ga_{0.5})_{0.5}In_{0.5}P$ (7.5 nm) barrier layer and a $Ga_{0.5}In_{0.5}P$ (5.5 nm) well layer.

A modification of Example 6 is an LED (not shown) that the balance of Ga and In in the well layer of the MQW active layer 17 is slightly changed (i.e., Ga reduced and In increased), so-called strained multiquantum well structure.

The two LED devices thus fabricated respectively have excellent initial characteristics, i.e., optical outputs of 1.12 and 1.21 mW and operating voltages of 1.84 and 1.84 V during power feeding at 20 mA (in evaluation).

Further, when the continuous current test is conducted under the same conditions as Example 1, the two LED devices have high relative outputs of 101% and 100%, respectively. Also, the LED device can be fabricated without being broken to enhance the product yield.

EXAMPLE 7

Example 7 features that the buffer layer 11 comprises GaP.

Figure 8:
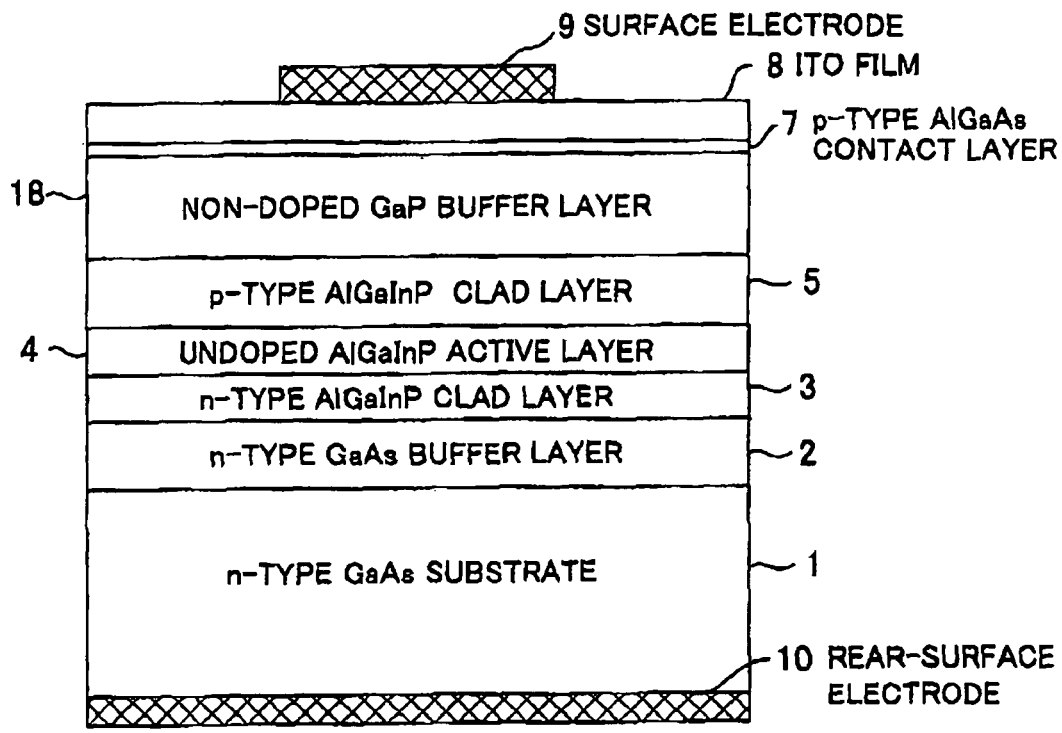
FIG. 8 is a schematic cross sectional view showing an AlGaInP-based red LED in Example 7 of the invention.

In Example 7, a red LED epitaxial wafer with a structure as shown in FIG. 8 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

However, in Example 7, a non-doped GaP buffer layer 18 is formed in place of the non-doped buffer layer 11. The GaP buffer layer 18 is grown at 670° C. and a V/III ratio of 30.

The LED device thus fabricated has excellent initial characteristics, i.e., an optical output of 1.11 mW and an operating voltage of 1.90 V during power feeding at 20 mA (in evaluation).

Further, when the continuous current test is conducted under the same conditions as Example 1, the LED device has a high relative output of 101%. Also, the LED device can be fabricated without being broken to enhance the product yield.

As described above, although the initial operating voltage of the LED device is slightly increased by the non-doped GaP buffer layer 18, the LED device is excellent in optical output and reliability and is capable of preventing the breaking of the device. The increase of the operating voltage depends on that the buffer layer comprises the GaP that is a lattice-mismatching material and has a wide bandgap.

Although the above embodiments offer the red LED device with an emission wavelength of 630 nm, the other LED devices fabricated by using the same AlGaInP-based material, e.g., an LED device with another emission wavelength of 560 nm to 660 nm can be fabricated such that it comprises the same material, carrier concentration in the other layers, using especially the same window layer. Thus, even when the emission wavelength of the LED device is different from that of the above embodiments, the same effects can be obtained.

Although the above embodiments have the n-type buffer layer 2 formed between the n-type GaAs substrate 1 and the n-type clad layer 3, the same effects can be obtained even when the n-type clad layer 3 is formed directly on the n-type GaAs substrate 1.

Although the above embodiments have the circular surface electrode 9, the other electrode shape such as rectangular, rhombic and polygonal can be used.

In the above embodiments, the semiconductor substrate comprises GaAs. Alternatively, an LED epitaxial wafer may comprise a Ge substrate, or GaAs or Ge substrate as a start substrate and then replaced by Si or a metallic self-standing substrate with a higher thermal conductivity than Si. Thereby, the same effects can be obtained.

In the above embodiments, the p-type clad layer 5 and the buffer layer 11 comprise a combination of AlInP and AlGaInP. However, the combination only has to compose a transparent material to the emission wavelength. Therefore, even the other combination than the embodiment can have the same effects.

COMPARATIVE EXAMPLE 1

Comparative Example 1 features that the buffer layer comprises AlGaAs.

Figure 10:
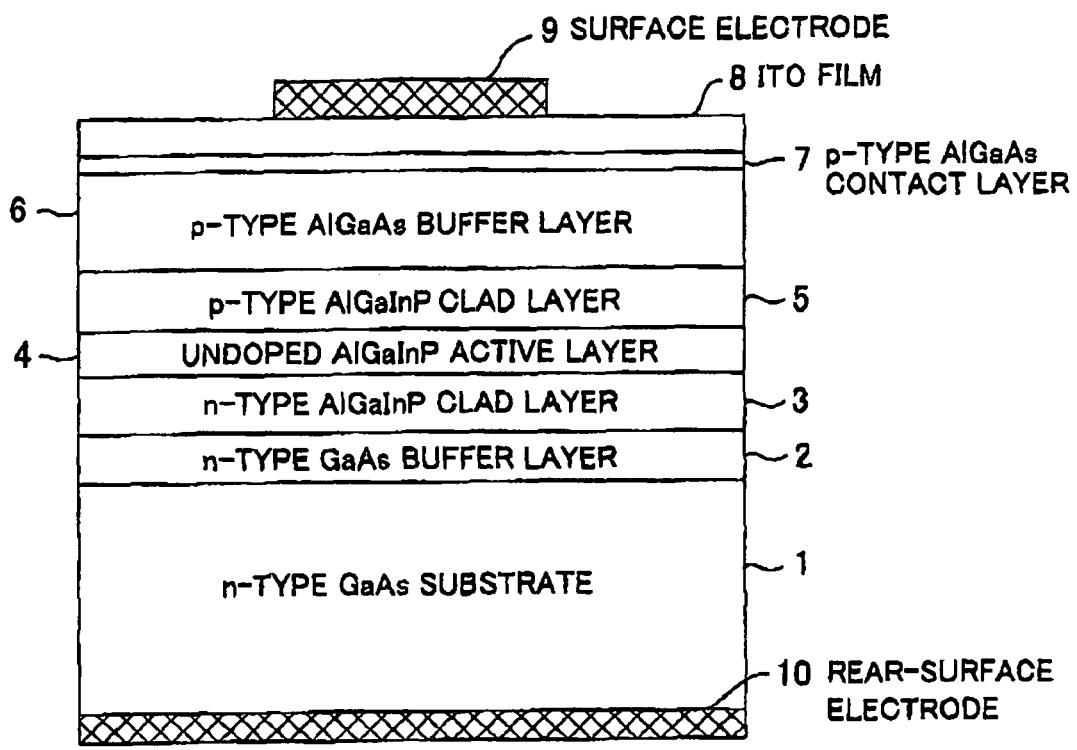
FIG. 10 is a schematic cross sectional view showing an AlGaInP-based red LED in Comparative Example 1.

In Comparative Example 1, a red LED epitaxial wafer with a structure as shown in FIG. 10 and an emission wavelength of about 630 nm is fabricated. Its epitaxial growth method, epitaxial layer thickness, epitaxial layer structure, electrode formation method, and LED device fabrication method are basically the same as those in Example 1 (FIG. 1).

However, in Comparative Example 1, a p-type (Mg-doped) $Al_{0.7}Ga_{0.3}As$ buffer layer 6 with a thickness of 600 nm is formed on the p-type clad layer 5. Namely, the non-doped $(Al_{0.7}Ga_{0.3})_{0.5}In_{0.5}P$ buffer layer 11 in Example 1 is removed and the p-type AlGaAs buffer layer 6 is formed instead. The p-type AlGaAs buffer layer 6 is made at a V/III ratio of 10.

Then, the LED epitaxial wafer thus fabricated is formed into an LED device by the same process as Example 1.

The LED device thus fabricated has initial characteristics, i.e., an optical output of 0.95 mW and an operating voltage of 1.84 V during power feeding at 20 mA (in evaluation). At this stage, none of the devices is broken to have a good product yield.

However, when the continuous current test is conducted under the same conditions as Example 1, the LED device has a relative output of 52% and an operating voltage of +0.06V (about 3% increased).

SIMS analysis is conducted for the LED device just after the formation of the LED device and for the LED device after the continuous current test under the above conditions. As a result, it is confirmed that, in the LED device of Comparative Example 1 after the continuous current test, Zn as a dopant of the p-type contact layer 7 is diffused in the active layer 4. Thus, the deterioration of device life or reliability in the LED device of Comparative Example 1 is caused by the dopant diffusion.

COMPARATIVE EXAMPLE 2

Comparative Example 2 features that the contact layer 7 and ITO film 8 are formed directly on the p-type clad layer 5 without using the buffer layer.

Figure 11:
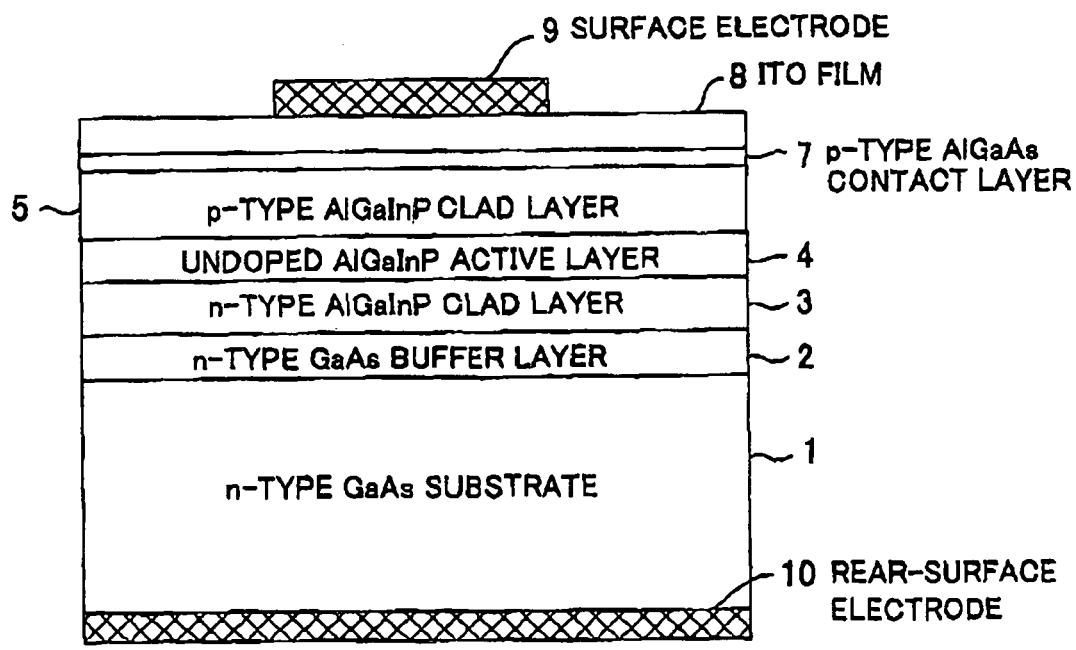
FIG. 11 is a schematic cross sectional view showing an AlGaInP-based red LED in Comparative Example 2.

In Comparative Example 2, a red LED epitaxial wafer with a structure as shown in FIG. 11 and an emission wavelength of about 630 nm is fabricated. Its epitaxial growth method, epitaxial layer thickness, epitaxial layer structure, electrode formation method, and LED device fabrication method are basically the same as those in Comparative Example 1 (FIG. 10).

However, in Comparative Example 2, the p-type buffer layer 6 is not formed. The p-type clad layer 5 only has to have a thickness of about 400 nm which is sufficient to provide the carrier confining effect and carrier supplying layer. Thus, the p-type clad layer 5 with a thickness of about 400 nm can function sufficiently as a clad layer. Namely, the compositions except the AlGaAs buffer layer 6 are the same as Comparative Example 1.

Then, the LED epitaxial wafer thus fabricated is formed into an LED device by the same process as Comparative Example 1.

The LED device thus fabricated has initial characteristics, i.e., an optical output of 0.90 mW and an operating voltage of 1.84 V during power feeding at 20 mA (in evaluation).

However, in evaluating the initial characteristics, about 20-30% of the devices are broken so that it does not emit light. Although the device not broken has the above-mentioned characteristics, the product yield at this stage is reduced. This is assumed because the device is broken in the wire bonding process before the device evaluation. When the continuous current test is conducted for the devices not broken under the same conditions as Comparative Example 1, the LED device has a relative output of 79% and an operating voltage of +0.008 V (about 0.4% increased).

As described above, in case of the structure without the buffer layer, the emission wavelength and reliability deteriorate as well as the product yield. Namely, although the relative output is a little improved as compared to Comparative Example 1, the product yield is contrary reduced.

EXAMPLE 8

Example 8 features that the buffer layer comprises a non-doped AlGaInP.

Figure 12:
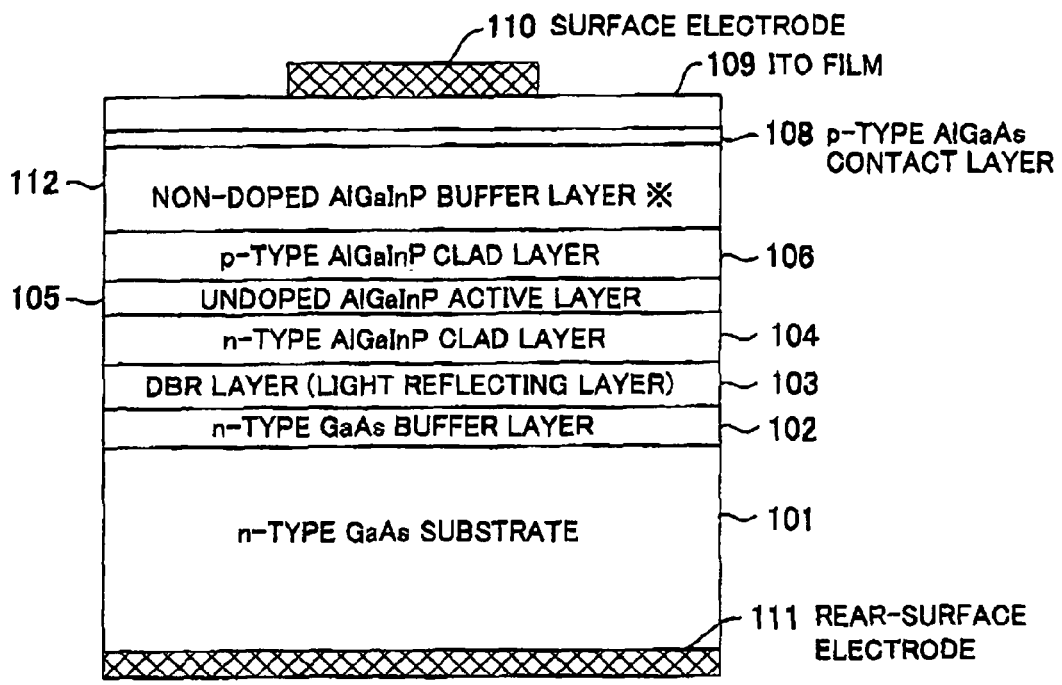
FIG. 12 is a schematic cross sectional view showing an AlGaInP-based red LED in Example 8 of the invention.

In Example 8, a red LED epitaxial wafer with a structure as shown in FIG. 12 and an emission wavelength of about 630 nm is fabricated. Its epitaxial growth method, epitaxial layer thickness, epitaxial layer structure, electrode formation method, and LED device fabrication method will be explained below.

On the n-type GaAs substrate 101, by the MOVPE method, an n-type (Si-doped) GaAs buffer layer 102 (with a thickness of 200 nm and a carrier concentration of $1\times10^{18}/cm^3$), and a light reflecting layer 103 are sequentially grown in lamination. The light reflecting layer 103 comprises 20 pairs of DBR (distributed Bragg reflector) where an AlInP layer and an $Al_{0.5}Ga_{0.5}As$ layer, 20 layers each, are alternately formed. The light reflecting layer 103 has a thickness of $\lambda_P/4n$, where $\lambda_P$ is an emission peak wavelength of the LED device and n is a refractive index of each of the semiconductor material to compose the light reflecting layer 103. The light reflecting layer 103 has a carrier concentration of about $1\times10^{18}/cm^3$.

Further, on the light reflecting layer 103, an n-type (Si-doped) $(Al_{0.7}Ga_{0.3})_{0.5}In_{0.5}P$ clad layer 104 (with a thickness of 400 nm and a carrier concentration of $1\times10^{18}/cm^3$), an undoped $(Al_{0.1}Ga_{0.9})_{0.5}In_{0.5}P$ active layer 105 (with a thickness of 600 nm), and a p-type (Mg-doped) $(Al_{0.7}Ga_{0.3})_{0.5}In_{0.5}P$ clad layer 106 (with a thickness of 400 nm and a carrier concentration of $5\times10^{17}/cm^3$) are sequentially grown in lamination by the MOVPE method.

Further, on the p-type (Mg-doped) $(Al_{0.7}Ga_{0.3})_{0.5}In_{0.5}P$ clad layer 106 (herein also called simply p-type clad layer 106), anon-doped $(Al_{0.7}Ga_{0.3})_{0.5}In_{0.5}P$ buffer layer 112 (with a thickness of 600 nm), and a p-type (Zn-doped) $Al_{0.1}Ga_{0.9}As$ contact layer 108 (with a thickness of 3 nm and a carrier concentration of $7\times10^{19}/cm^3$) are sequentially grown in lamination by the MOVPE method.

The non-doped $(Al_{0.7}Ga_{0.3})_{0.5}In_{0.5}P$ buffer layer 112 (herein called simply non-doped buffer layer 112 or buffer layer 112) comprises a group III/V semiconductor that comprises P (phosphorus) as a main group V element, being lattice-matched to the semiconductor substrate 1 and being undoped. For example, the non-doped buffer layer 112 comprises AlInP or AlGaInP which is optically transparent to the emission wavelength and lattice-matched to the substrate. The thickness of the buffer layer 112 is set such that a sum of the thicknesses (in general, 200 nm to 600 nm) of the buffer layer 112 and the p-type clad layer 106 falls within a range of 1000 nm to 3000 nm. Namely, the thickness of the buffer layer 112 is set within a range of about 400 nm to 2800 nm. The thickness is suited to obtain a structure which can prevent a device from being broken in a wire bonding step.

The p-type (Zn-doped) $Al_{0.1}Ga_{0.9}As$ contact layer 108 (herein also called simply p-type contact layer 7) comprises $Al_xGa_{1-x}As$ ($0\leqq X\leqq0.4$), has a film thickness of 1 nm or more and 30 nm or less, and doped with Zn at a high density of $1\times10^{19}/cm^3$ or more.

The growth temperature in the MOVPE growth is set at 650° C. from the n-type GaAs buffer layer 102 to the non-doped AlGaInP buffer layer 112, and the growth temperature of the p-type contact layer 108 is set at 550° C. The other growth conditions are a growth pressure of about 6666 Pa (50 Torr), a growth rate of the respective layers in the range of 0.3 to 1.0 nm/sec, and a V/III ratio of about 150.

However, the non-doped $(Al_{0.7}Ga_{0.3})_{0.5}In_{0.5}P$ buffer layer 112 has suitably a V/III ratio of 200 so as to reduce the H (hydrogen)-concentration. By setting the V/III ratio to be 200, the non-doped $(Al_{0.7}Ga_{0.3})_{0.5}In_{0.5}P$ buffer layer 112 can have a H-concentration reduced to $3\times10^{17}$ atoms/cm$^3$ or less. Although C (carbon) may be mixed unavoidably in the buffer layer 112, the C-concentration thereof is also reduced to $5\times10^{16}$ atoms/cm$^3$ or less. The p-type contact layer 108 has a V/III ratio of 10. Herein, the V/III ratio is a ratio (quotient) obtained by a denominator, which is the number of moles of a group III material such as TMGa or TMAl, and a numerator, which is the number of moles of a group V material such as $AsH_3$ or $PH_3$.

A material used in the MOVPE growth can be an organic metal such as trimethyl gallium (TMGa) or triethyl gallium (TEGa), trimethyl aluminum (TMAl) and trimethyl indium (TMIn), or a hydride gas such as arsine ($AsH_3$) and phosphine ($PH_3$). A dopant material for an n-type layer such as the n-type buffer layer 102 can be disilane ($Si_2H_6$). A dopant material for a conductivity-determining impurity of a p-type layer such as the p-type clad layer 106 can be biscyclopentadienyl magnesium ($Cp_2Mg$). However, diethyl zinc (DEZn) is used only for the p-type contact layer 108.

Furthermore, a dopant material for a conductivity-determining impurity of an n-type layer can be also hydrogen selenide ($H_2Se$), monosilane ($SiH_4$), and diethyl tellurium (DETe) A p-type dopant material for the p-type clad layer 106 can be also dimethyl zinc (DMZn) and diethyl zinc (DEZn).

In addition, after the LED epitaxial wafer is taken out from the MOVPE furnace, the ITO film 109 with a thickness of 80 nm is formed by the vacuum deposition method on the surface of the wafer, i.e., the upper surface side of the p-type contact layer 108. In this structure, the ITO film 109 composes the current spreading layer. The ITO film 109 as the current spreading layer has a thickness in a range of ±30% of d calculated by a relational expression of $d=A\times\lambda_P/(4\times n)$, where A is a constant (A=1 or 3), $\lambda_P$ is an emission wavelength (nm), and n is a refractive index. The ITO film 109 is formed by a vacuum deposition method or a sputtering method. The ITO film 109 has preferably a carrier concentration of $8\times10^{20}/cm^3$ or more just after the film formation.

An evaluating glass substrate set in the same batch as for the deposition of the ITO film 109 is taken out and cut into a size enough for the Hall measurement, and the electric characteristics of only the ITO film 109 are evaluated. As a result, a carrier concentration thereof is $1.1\times10^{21}/cm^3$, a mobility is 16.7 cm$^2$/Vs, and a resistivity is $3.3\times10^{-4}$ Ω·cm.

Then, the surface electrode 110 as a circular electrode and with a diameter of 110 μm is provided in the form of a matrix on the upper surface of the epitaxial wafer by the vacuum deposition method by using tools or materials and process used for a general photolithography process such as a resist and a mask aligner. A liftoff method is used in electrode formation after the deposition. The surface electrode 110 is formed by sequentially depositing Ni (nickel) and Au (gold) with thicknesses of 20 nm and 500 nm, respectively. Furthermore, on the entire bottom surface of the epitaxial wafer, the rear-surface electrode 111 is formed by the same vacuum deposition method. The rear-surface electrode 111 is formed by sequentially depositing AuGe (gold-germanium alloy), Ni (nickel), and Au (gold) with thicknesses of 60 nm, 10 nm, and 500 nm, respectively. Then, an alloy process to alloy the electrode is performed such that the electrode is heated at 400° C. in a nitrogen gas atmosphere for 5 minutes.

Then, the LED epitaxial wafer with the electrode formed as described above is cut by a dicer such that the elliptic surface electrode 110 is located nearly at the center, so as to obtain an LED bear chip with a chip size of 300 μm square. Then, the LED bear chip is mounted (die-bonding) on a TO-18 stem. Then, the LED bear chip is wire-bonded to have the LED device.

Initial characteristics of the LED device thus fabricated are evaluated. As a result, the LED device has excellent initial characteristics, i.e., an optical output of 2.05 mW and an operating voltage of 1.85 V during the power feeding at 20 mA (in evaluation).

Furthermore, a continuous current test for 168 hours (=1 week) is conducted where the LED device is driven at 50 mA in the environment of an atmospheric humidity. As relative values as compared to those before the test, optical output is 102% (provided that optical output before the power feeding is 100%; hereinafter referred to as relative output), and operation voltage is +0.004 V (about 0.2% increased).

As described above, since the buffer layer 112 is composed of non-doped and low H-concentration and C-concentration material, the Zn diffusion from the contact layer 108 can be suppressed very effectively. Also, since the buffer layer 112 is composed of AlGaInP or AlInP to contain P as a group V element without using an As-based material transparent to the undoped $(Al_{0.1}Ga_{0.9})_{0.5}In_{0.5}P$ active layer 105 (herein also called simply active layer 105) such as AlGaAs with high Al ratio in mixed crystal, it can have excellent initial characteristics and high reliability. Further, since it is composed of AlGaInP-based or AlInP-based material lattice-matched to the substrate without using the wide bandgap and lattice-mismatching P-based materials such as GaP, the initial operating voltage thereof can be also reduced.

SIMS analysis is conducted for the LED device just after the formation of the LED device and for the LED device after the continuous current test under the above conditions. As a result, it is confirmed that, in the LED device of Example 8 after the continuous current test, Zn as a dopant of the p-type contact layer 108 is not mixed in the active layer 105 and is rarely diffused from the contact layer 108. Thus, as described in Example 8, the dopant diffusion in the LED device can be suppressed by using the non-doped and low H-concentration AlGaInP buffer layer 112.

Meanwhile, in case of the AlGaInP buffer layer 112, the absolute value of a lattice-mismatch ratio to the underlying semiconductor layer is 0.3% or less.

Figure 13:
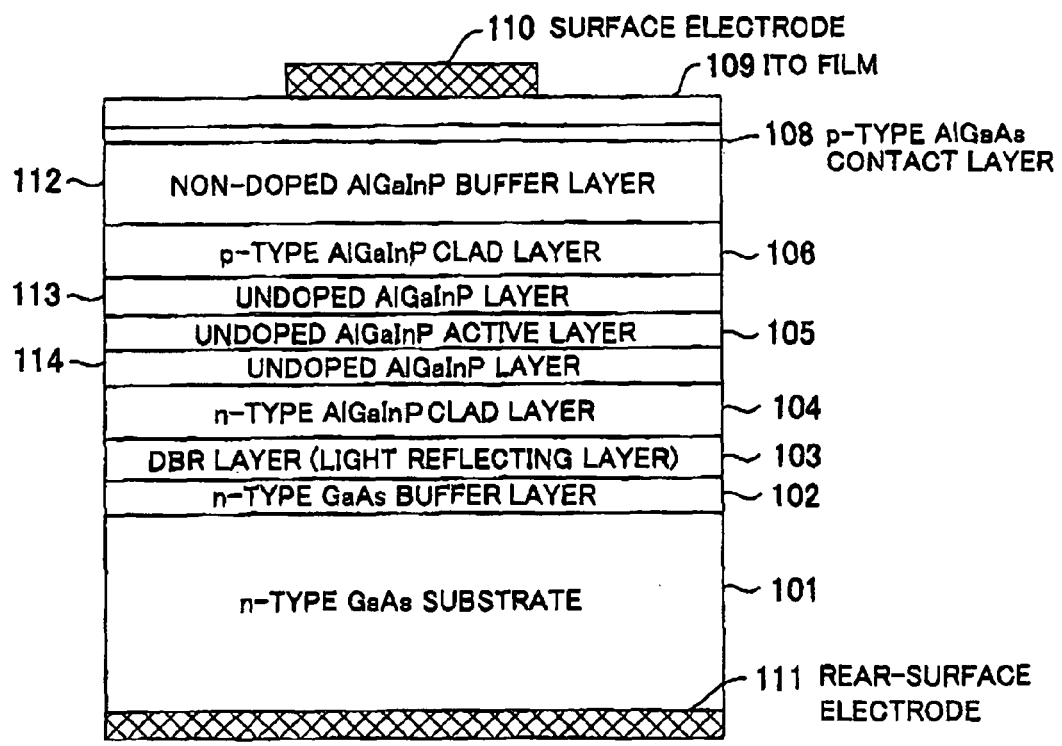
FIG. 13 is a schematic cross sectional view showing a modification of the AlGaInP-based red LED in Example 8 of the invention.

FIG. 13 shows a modification of Example 8. The modification is structured such that, provided that the buffer layer 112 is formed which comprises AlGaInP-based or AlInP-based material without being doped intentionally and with a low H-concentration, an AlGaInP undoped layer 113 is as a diffusion preventing layer formed between the active layer 105 and the p-type clad layer 106 and an AlGaInP undoped layer 114 is as a diffusion preventing layer formed between the n-type (Si-doped) $(Al_{0.7}Ga_{0.3})_{0.5}In_{0.5}P$ clad layer 104 (herein also called simply n-type clad layer 104) and the active layer 105. Alternatively, a low carrier concentration layer can be formed as a diffusion preventing layer instead of these undoped layers.

EXAMPLE 9

Example 9 features that the buffer layer comprises non-doped AlGaInP and the non-doped buffer layer is sandwiched by the clad layers.

Figure 14:
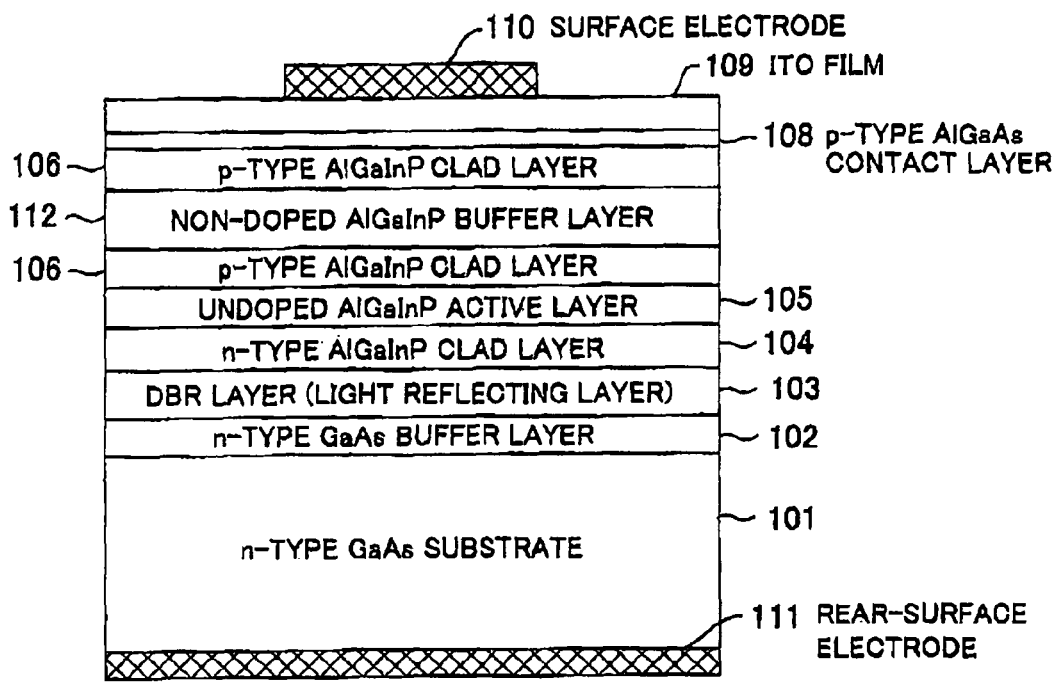
FIG. 14 is a schematic cross sectional view showing an AlGaInP-based red LED in Example 9 of the invention.

In Example 9, a red LED epitaxial wafer with a structure as shown in FIG. 14 and an emission wavelength of about 630 nm is fabricated. Its epitaxial growth method, epitaxial layer thickness, epitaxial layer structure, electrode formation method, and LED device fabrication method are basically the same as those in Example 8.

However, in Example 9, the p-type clad layer 106 has a thickness of 200 nm, and the non-doped $(Al_{0.7}Ga_{0.3})_{0.5}In_{0.5}P$ buffer layer 112 with a thickness of 600 nm is formed thereon, and the same layer as the p-type clad layer 106 with a thickness of 200 nm is formed thereon.

The non-doped $(Al_{0.7}Ga_{0.3})_{0.5}In_{0.5}P$ buffer layer 112 has a V/III ratio of 200. By setting the V/III ratio to be 200, the non-doped $(Al_{0.7}Ga_{0.3})_{0.5}In_{0.5}P$ buffer layer 112 can have a H-concentration reduced to $3 \times 10^{17}$ atoms/cm$^3$ or less and a C-concentration reduced to $5 \times 10^{16}$ atoms/cm$^3$ or less.

The LED device has excellent initial characteristics, i.e., an optical output of 1.98 mW and an operating voltage of 1.86 V as well as a high relative output of 99%. Further, it is confirmed that Zn is not diffused into the active layer as the result of the SIMS analysis of the LED device after conducting the continuous current test under the same conditions as Example 8.

EXAMPLE 10

Example 10 features that the buffer layer comprises non-doped AlGaInP and an undoped layer or low-doped layer is formed between the active layer and the clad layer.

Figure 15:
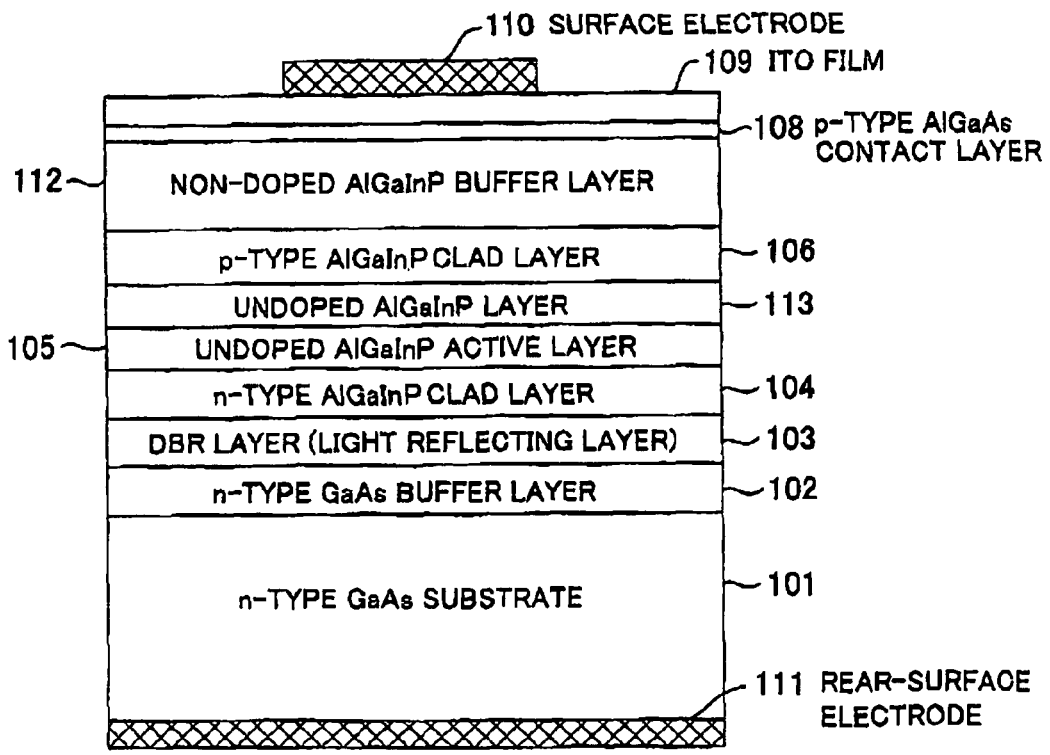
FIG. 15 is a schematic cross sectional view showing an AlGaInP-based red LED in Example 10 of the invention.

In Example 10, a red LED epitaxial wafer with a structure as shown in FIG. 15 and an emission wavelength of about 630 nm is fabricated. Its epitaxial growth method, epitaxial layer thickness, epitaxial layer structure, electrode formation method, and LED device fabrication method are basically the same as those in Example 8.

However, in Example 10, the $(Al_{0.7}Ga_{0.3})_{0.5}In_{0.5}P$ undoped layer 113 with a thickness of 75 nm is formed between the active layer 105 and the p-type clad layer 106.

Figure 16:
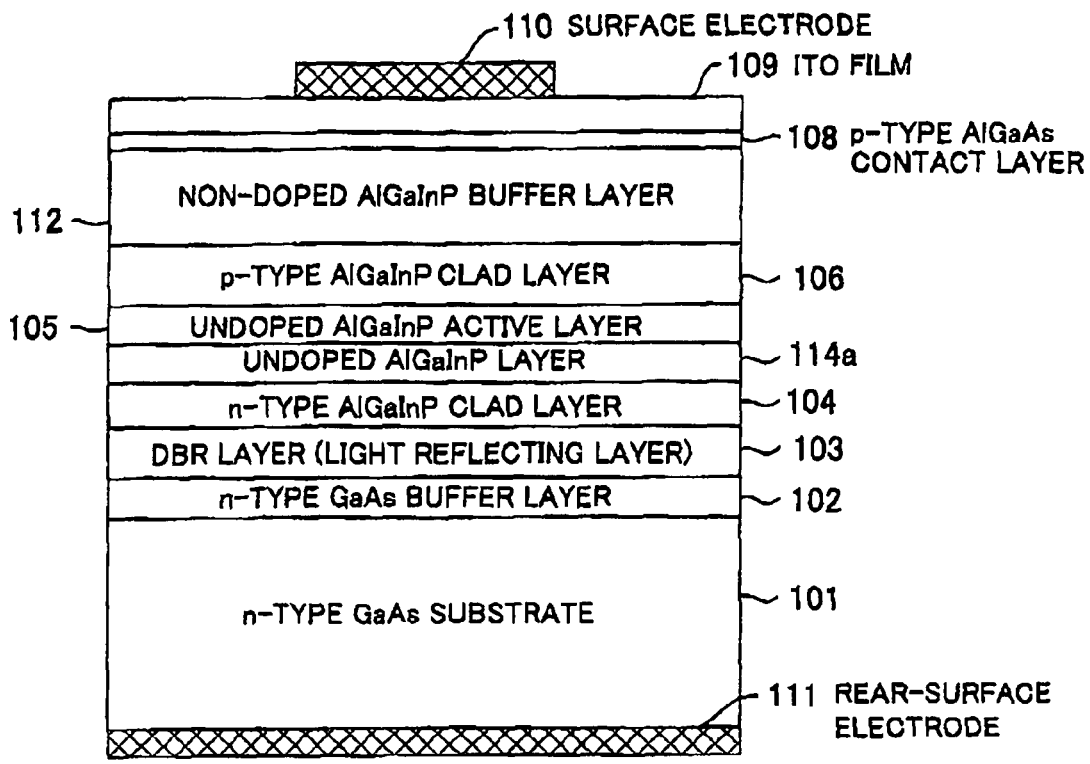
FIG. 16 is a schematic cross sectional view showing a modification of the AlGaInP-based red LED in Example 10 of the invention.

Modifications of Example 3 are an LED as shown in FIG. 16 that a $(Al_{0.7}Ga_{0.3})_{0.5}In_{0.5}P$ undoped layer 114a with a thickness of 75 nm is formed between the n-type clad layer 104 and the active layer 105, and an LED (not shown) that a $(Al_{0.7}Ga_{0.3})_{0.5}In_{0.5}P$ low-doped layer (with Si-doped, a carrier concentration of $2 \times 10^{17}/cm^3$) with a thickness of 75 nm is formed in place of the undoped layer 114a.

The three LED devices thus fabricated have excellent initial characteristics, i.e., an optical output of 1.97-2.15 mW and an operating voltage of 1.85-1.888 V as well as a high relative output of 101-105%.

EXAMPLE 11

Example 11 features that the buffer layer and the p-type clad layer each comprise AlInP.

Figure 17:
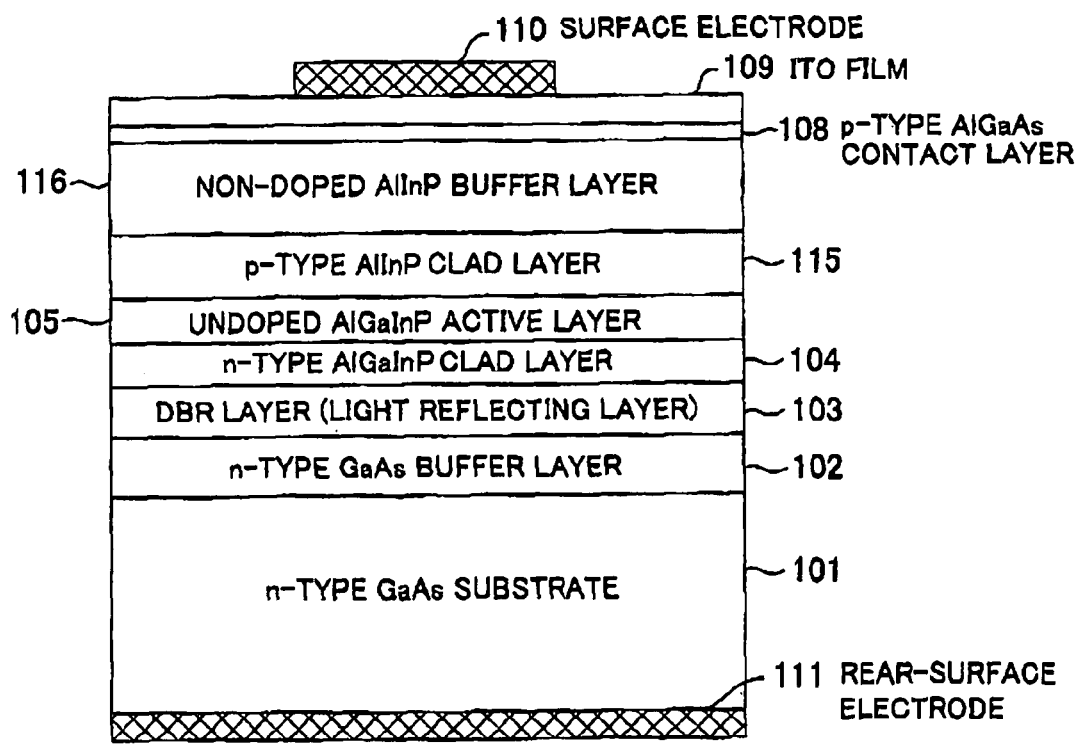
FIG. 17 is a schematic cross sectional view showing an AlGaInP-based red LED in Example 11 of the invention.

In Example 11, a red LED epitaxial wafer with a structure as shown in FIG. 17 and an emission wavelength of about 630 nm is fabricated. Its epitaxial growth method, epitaxial layer thickness, epitaxial layer structure, electrode formation method, and LED device fabrication method are basically the same as those in Example 8.

However, in Example 11, a p-type AlInP clad layer 115 and a non-doped AlInP buffer layer 116 are formed in place of the p-type clad layer 106 and the non-doped and low H-concentration buffer layer 112. They are 400 nm and 600 nm, respectively, in thickness.

A modification of Example 11 is an LED (not shown) that a p-type AlInP clad layer 115 and the non-doped buffer layer 112 are formed in place of layers 115 and 116, respectively.

The two LED devices thus fabricated respectively have excellent initial characteristics, i.e., optical outputs of 1.96 and 2.11 mW and operating voltages of 1.88 and 1.87 V during power feeding at 20 mA (in evaluation).

Further, when the continuous current test is conducted under the same conditions as Example 8, the two LED devices have relative outputs of 97% and 99%, respectively. Thus, by the structure as described in Example 11, the LED device can have the excellent initial characteristics.

EXAMPLE 12

Example 12 features that a multiquantum well (MQW) is formed.

Figure 18:
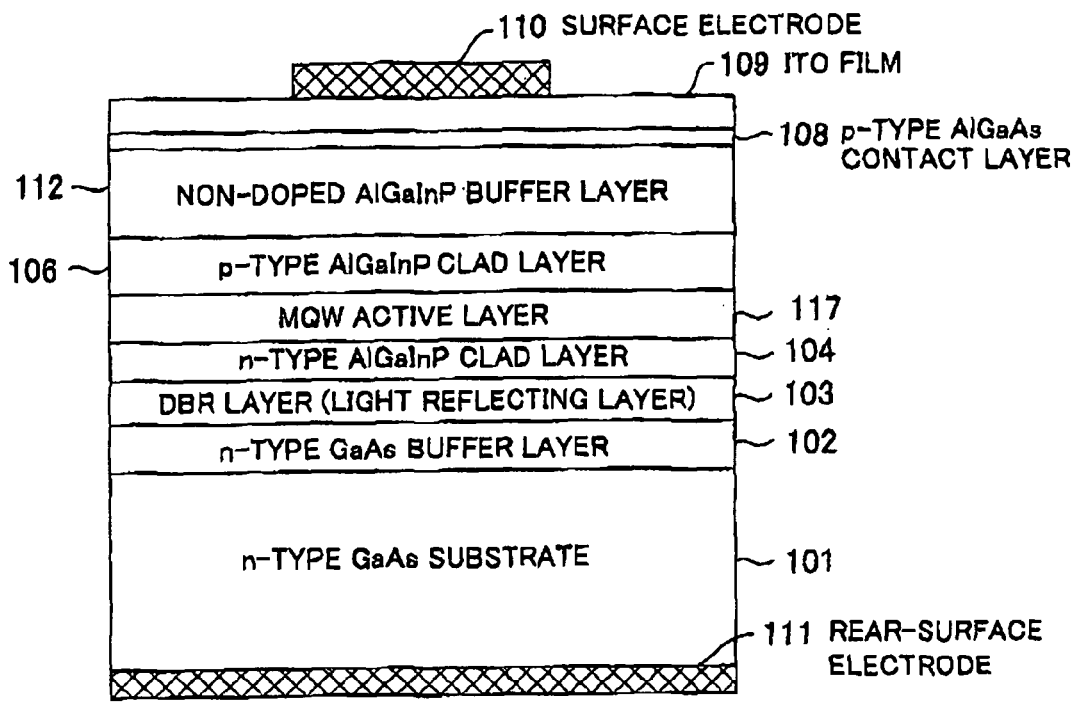
FIG. 18 is a schematic cross sectional view showing an AlGaInP-based red LED in Example 12 of the invention.

In Example 12, a red LED epitaxial wafer with a structure as shown in FIG. 18 and an emission wavelength of about 630 nm is fabricated. Its epitaxial growth method, epitaxial layer thickness, epitaxial layer structure, electrode formation method, and LED device fabrication method are basically the same as those in Example 8.

However, in Example 12, the active layer 105 comprises a MQW active layer 17. The MQW is composed of 40.5 pairs of a $(Al_{0.5}Ga_{0.5})_{0.5}In_{0.5}P$ (7.5 nm) barrier layer and a $Ga_{0.5}In_{0.5}P$ (5.5 nm) well layer.

A modification of Example 12 is an LED (not shown) that the balance of Ga and In in the well layer of the MQW active layer 17 is slightly changed (i.e., Ga reduced and In increased), so-called strained multiquantum well structure.

The two LED devices thus fabricated respectively have excellent initial characteristics, i.e., optical outputs of 2.12 and 2.21 mW and operating voltages of 1.84 and 1.84 V during power feeding at 20 mA (in evaluation).

Further, when the continuous current test is conducted under the same conditions as Example 8, the two LED devices have high relative outputs of 101% and 100%, respectively. Thus, by the structure as described in Example 12, the LED device can have the excellent initial characteristics.

EXAMPLE 13

Example 13 features that the buffer layer 11 comprises GaP.

Figure 19:
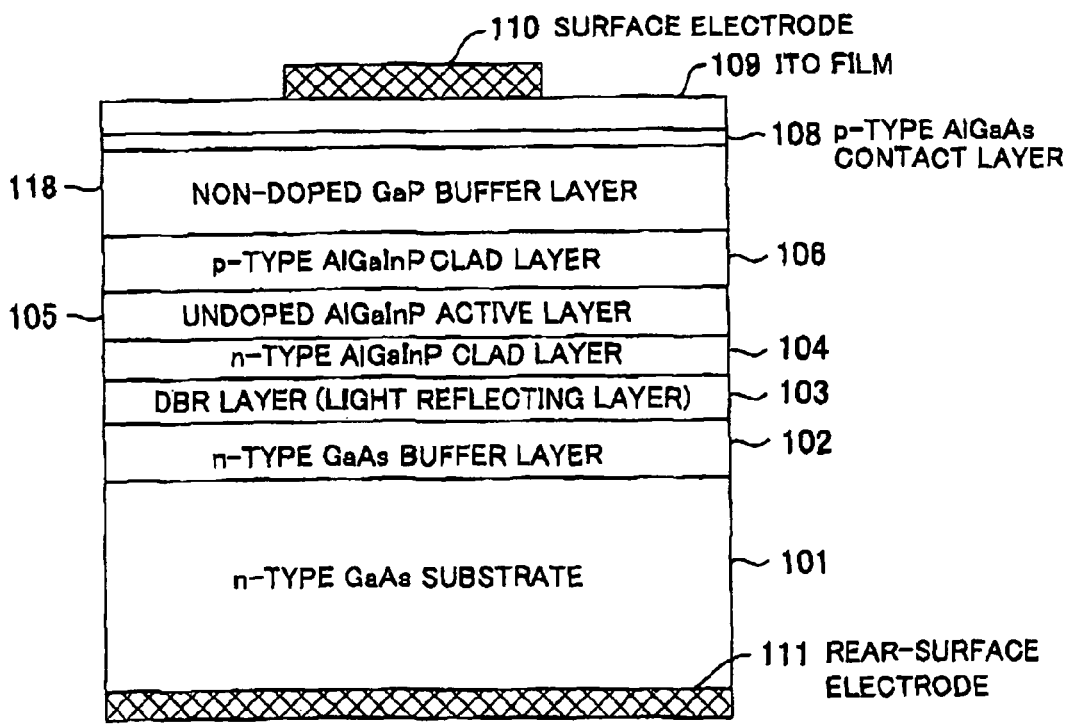
FIG. 19 is a schematic cross sectional view showing an AlGaInP-based red LED in Example 13 of the invention.

In Example 13, a red LED epitaxial wafer with a structure as shown in FIG. 19 and an emission wavelength of about 630 nm is fabricated. Its epitaxial growth method, epitaxial layer thickness, epitaxial layer structure, electrode formation method, and LED device fabrication method are basically the same as those in Example 8.

However, in Example 13, a non-doped GaP buffer layer 18 with a thickness of 600 nm is formed in place of the non-doped buffer layer 112, and a p-type (Zn-doped) $Al_{0.1}Ga_{0.9}As$ contact layer 108 with a thickness of 3 nm and a carrier concentration of $7 \times 10^{19}/cm^3$ is sequentially formed thereon by the MOVPE method.

The growth temperature in the MOVPE growth is set at 650° C. from the n-type GaAs buffer layer 102 to the p-type clad layer 106, and the growth temperature of the p-type contact layer 108 is set at 550° C. The GaP buffer layer 118 is grown at 680° C. and a V/III ratio of 50.

The LED device thus fabricated has excellent initial characteristics, i.e., an optical output of 2.18 mW and an operating voltage of 1.93 V during power feeding at 20 mA (in evaluation).

Further, when the continuous current test is conducted under the same conditions as Example 8, the LED device has a relative output of 95%.

As described above, although the initial operating voltage of the LED device is slightly increased by the non-doped GaP buffer layer 118 and the reliability thereof degrades slightly, the LED device is excellent in optical output. The increase of the operating voltage depends on that the buffer layer comprises the GaP that is a lattice-mismatching material and has a wide bandgap. Also, the degradation of the reliability depends on GaP.

Optimum Conditions

The optimum conditions for obtaining the semiconductor light-emitting device with the non-doped buffer layer according to the invention will be explained below.

First, the contact layer 108 contacting the ITO film 109 as a current spreading layer needs to be doped with very high concentration conductivity-determining impurity. For example, in the case of the contact layer 108 with Zn doped thereinto, it is desired that the Al ratio of the mixed crystal material is from zero, i.e., GaAs, to 0.4, i.e., $Al_{0.4}Ga_{0.6}As$. The carrier concentration is desirably $1 \times 10^{19}/cm^3$ or more, which is preferably as high as possible.

The ITO film 109 belongs basically to n-type semiconductor. The LED is generally fabricated p-side up. Thus, the LED using the ITO film 109 as the current spreading layer has, in conductivity type, a junction of n/p/n viewing from the substrate side. Therefore, the LED has a large potential barrier generated at the interface between the ITO film 109 and the p-type semiconductor layer, and the LED must have generally a very high operating voltage. To solve this problem, the contact layer 108 needs to be a p-type semiconductor layer with a very high carrier concentration. The reason why the contact layer 108 has a narrow bandgap is that the high carrier concentration can be facilitated by such a narrow bandgap.

In connection with the high carrier concentration of the contact layer 108, it is important that the ITO film 109 contacting the contact layer 108 has a high carrier concentration. For the same reason as the contact layer 108, it is preferred that its carrier concentration is as high as possible. The ITO film 109 has preferably a carrier concentration of $8 \times 10^{20}/cm^3$ or more.

Second, it is preferred that the contact layer 108 has a thickness of 1 nm or more and 30 nm or less. This is because the contact layer 108 has a bandgap to absorb light emitted from the active layer 105, and the optical output lowers as the thickness thereof increases. As shown in FIG. 9, the upper limit of the thickness of the contact layer 108 is preferably about 30 nm. If the thickness of the contact layer 108 is less than 1 nm, it is difficult to have the tunnel junction between the ITO film 109 and the contact layer 108. Therefore, the operating voltage is difficult to lower and stabilize. Accordingly, it is preferred that the contact layer 108 contacting the ITO film 109 has a thickness of 1 nm to 30 nm.

Third, it is preferred that the ITO film 109 as the current spreading layer comprising a metal oxide has a thickness in a range of ±30% of d calculated by a relational expression of $d = A \times \lambda_P / (4 \times n)$, where A is a constant (A=1 or 3), $\lambda_P$ is an emission wavelength (nm), and n is a refractive index.

The ITO film 109 formed on the LED epitaxial wafer has a refractive index nearly in the middle of the semiconductor layer and the air layer, and it functions optically as a reflection preventing film. Thus, in order to increase the light extraction efficiency to enhance the optical output of the LED device, it is preferred that it has a thickness according to the above relational expression.

Figure 20:
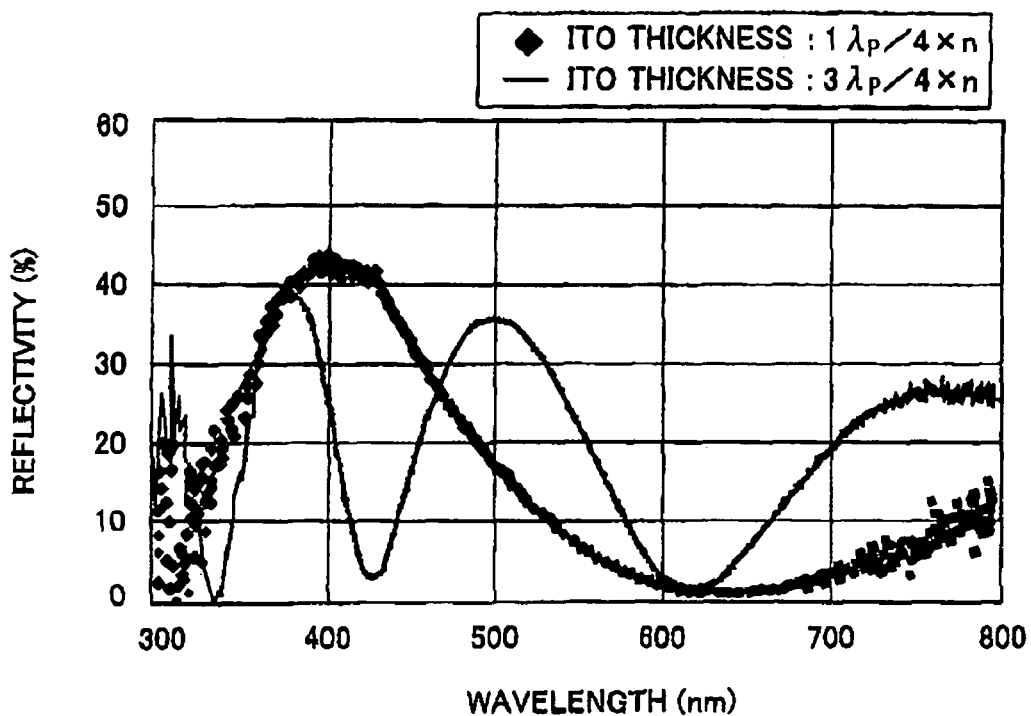
FIG. 20 is a diagram showing a reflectivity spectrum of an ITO film formed on a GaAs substrate.

However, as the ITO film 109 increases in thickness, the transmissivity may degrade. If the intrinsic transmissivity of the ITO film 109 lowers, a rate of light to be absorbed by the ITO film 109 after being emitted from the active layer 105 increases. As a result, the optical output will lower. Further, as the ITO film 109 increases in thickness, the optical interference will increase in the current spreading layer and wavelength region with high light extraction efficiency will be narrowed. In this regard, FIG. 20 shows the measurement result that, preparing a sample that the ITO film 109 is formed on the GaAs substrate 101, spectra of reflected light is measured when light is incident perpendicularly to this sample.

For these reasons, the preferred thickness d of the current spreading layer is determined by the expression, where the constant A is preferably 1 or 3. The ITO film 109 as a current spreading layer formed on the LED epitaxial wafer has desirably a thickness in the range of ±30% of d calculated by the relational expression. This is because a wavelength band, i.e., a wavelength band with a high light extraction efficiency, with an optically low reflectivity to serve as a reflection preventing film has a certain width. For example, tolerance in thickness of a reflection preventing film to have a reflectivity of 15% or less when light is incident perpendicularly to the LED epitaxial wafer is in the range of ±30% of d calculated by the relational expression. If d exceeds ±30%, the effect of the reflection preventing film lowers and the optical output of the LED device lowers.

Fourth, it is preferred that the buffer layer 112 inserted between the contact layer 108 and the p-type clad layer 106 has a thickness of 400 nm or more and 2800 nm or less. For example, when the p-type clad layer 106 has a thickness of 400 nm, the buffer layer 112 has preferably a thickness of 600 nm to 2600 nm. The reason why the thickness of the buffer layer 11 is set 400 nm or more is that, if the distance from the active layer 105 to the surface electrode 110 is too short, the LED device may be broken by ultrasonic vibration etc. in the wire bonding process of the LED device fabrication. On the other hand, the reason why the upper limit is set 2800 nm or less is that the current spreading property of the LED device can be sufficiently obtained by the ITO film 109 formed on the contact layer 108. If the buffer layer 112 is thickened about 10 μm, the optical output of the LED device cannot be enhanced significantly since the current spreading effect of the ITO film 109 as described earlier is predominant. On the contrary, the fabrication cost of the LED device will be increased and the LED device must be thus increased in production cost. Accordingly, it is preferred that the buffer layer 112 has a thickness of about 400 nm to 2800 nm, since the p-type clad layer 106 has generally a thickness of 200 nm to 600 nm.

In this invention, the buffer layer 112 may have the same composition as the p-type clad layer 106. Even in this case, it is preferred that the distance from the upper end of the active layer 105 to the lower end of the contact layer 108 is 1000 nm or more and 3000 nm or less.

Fifth, it is desired that the undoped layers 113, 114a and the low-doped layer contacting the active layer 105 have a thickness of 100 nm or less since, if the thickness is too large, the supply of carrier to the active layer 105 degrades, the optical output lowers and the fabrication cost increases.

Figure 21:
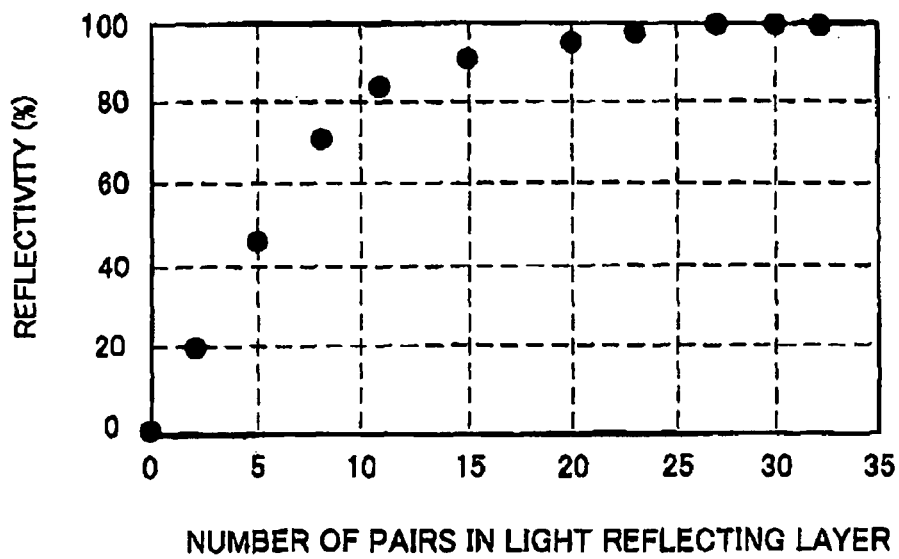
FIG. 21 is a graph showing relationships between number of pairs in light reflecting layer and perpendicular reflectivity.

Sixth, it is preferred that the number of pairs in the light reflecting layer 103 is in the range of 10 to 30 pairs. The lower limit is set because 10 pairs are needed to have a sufficient reflectivity in the light reflecting layer 103. In this regard, FIG. 21 shows the relationship between the number of pairs in the light reflecting layer and the perpendicular reflectivity.

The reasons for the upper limit are as follows.

Even if the light reflecting layer 103 is thickened so much, the reflectivity or the optical output of the LED device is not always increased by that much. As shown in FIG. 21, the reflectivity of the light reflecting layer 103 tends to be almost saturated at 20 and a few pairs or more, being completely saturated at 30 pairs or more. Thus, the number of pairs needs to be more than a certain number in order to have an effective reflectivity. In addition, in order to fabricate the LED device and LED epitaxial wafer at low cost and efficiently, it is preferred that the number of pairs in the light reflecting layer 103 has an upper limit of 30 pairs or less.

Materials suitable for the light reflecting layer 103 can be $Al_xGa_{1-x}As$ ($0.4 \leq X \leq 1$) or $(Al_xGa_{1-x})_YIn_{1-Y}P$ ($0 \leq X \leq 1$ and $0.4 \leq Y \leq 0.6$). The reason for selecting these materials is that they are almost lattice-matched to the GaAs substrate 101 and optically transparent to a wavelength of light emitted from the LED device. It is known that, as a difference in refractive index between two materials to compose the DBR, i.e., the light reflecting layer 103, is increased, the reflection wavelength band of light is broadened and the reflectivity is increased. Therefore, it is preferred that the above materials are selected.

Although the above embodiments offer the red LED device with an emission wavelength of 630 nm, the other LED devices fabricated by using the same AlGaInP-based material, e.g., an LED device with another emission wavelength of 560 nm to 660 nm can be fabricated such that it comprises the same material, carrier concentration in the other layers, using especially the same window layer. Thus, even when the emission wavelength of the LED device is different from that of the above embodiments, the same effects can be obtained.

Although the above embodiments have the n-type buffer layer 102 formed between the n-type GaAs substrate 101 and the n-type clad layer 104, the same effects can be obtained even when the n-type clad layer 104 or the DBR 103 is formed directly on the n-type GaAs substrate 101.

Although the above embodiments have the circular surface electrode 110, the other electrode shape such as rectangular, rhombic and polygonal can be used.

In the above embodiments, the semiconductor substrate comprises GaAs. Alternatively, an LED epitaxial wafer may comprise a Ge substrate, or GaAs or Ge substrate as a start substrate and then replaced by Si or a metallic self-standing substrate with a higher thermal conductivity than Si. Thereby, the same effects can be obtained.

In the above embodiments, the p-type clad layer 106 and the buffer layer 112 comprise a combination of AlInP and AlGaInP. However, the combination only has to compose a transparent material to the emission wavelength. Therefore, even the other combination than the embodiment can have the same effects.

COMPARATIVE EXAMPLE 3

Comparative Example 3 features that the buffer layer comprises AlGaAs.

Figure 22:
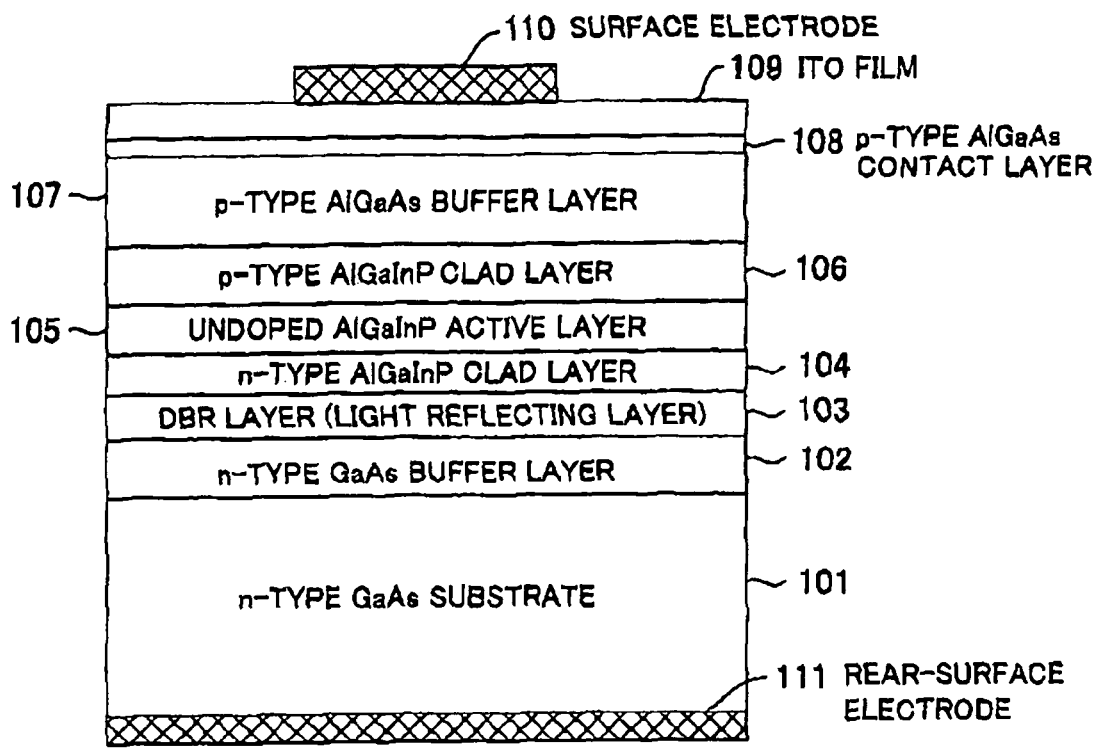
FIG. 22 is a schematic cross sectional view showing an AlGaInP-based red LED in Comparative Example 3.

In Comparative Example 3, a red LED epitaxial wafer with a structure as shown in FIG. 22 and an emission wavelength of about 630 nm is fabricated. Its epitaxial growth method, epitaxial layer thickness, epitaxial layer structure, electrode formation method, and LED device fabrication method are basically the same as those in Example 8.

However, in Comparative Example 3, a p-type (Mg-doped) $Al_{0.8}Ga_{0.2}As$ buffer layer 107 with a thickness of 600 nm and a carrier concentration of $1 \times 10^{18}/cm^3$ is formed on the p-type clad layer 106. The p-type AlGaAs buffer layer 107 is made at a V/III ratio of 30. The p-type dopant material for the p-type buffer layer 107 can be dimethylzinc (DMZn) and dimethylzinc (DEZn)

Then, the LED epitaxial wafer thus fabricated is formed into an LED device by the same process as Example 8.

The LED device thus fabricated has initial characteristics, i.e., an optical output of 1.61 mW and an operating voltage of 1.86 V during power feeding at 20 mA (in evaluation).

However, when the continuous current test is conducted under the same conditions as Example 8, the LED device has a relative output of 63% as compared to the optical output before the test.

SIMS analysis is conducted for the LED device just after the formation of the LED device and for the LED device after the continuous current test under the above conditions. As a result, it is confirmed that, in the LED device of Comparative Example 3, Zn as a dopant of the p-type contact layer 108 is apparently diffused in the active layer 105 even before the test, and, after the test, the amount Zn diffused in the active layer 105 is further increased. Thus, the deterioration of device life or reliability in the LED device of Comparative Example 3 is caused by the dopant diffusion.

COMPARATIVE EXAMPLE 4

Comparative Example 4 features that the contact layer 108 and ITO film 109 are formed directly on the p-type clad layer 106 without using the buffer layer.

Figure 23:
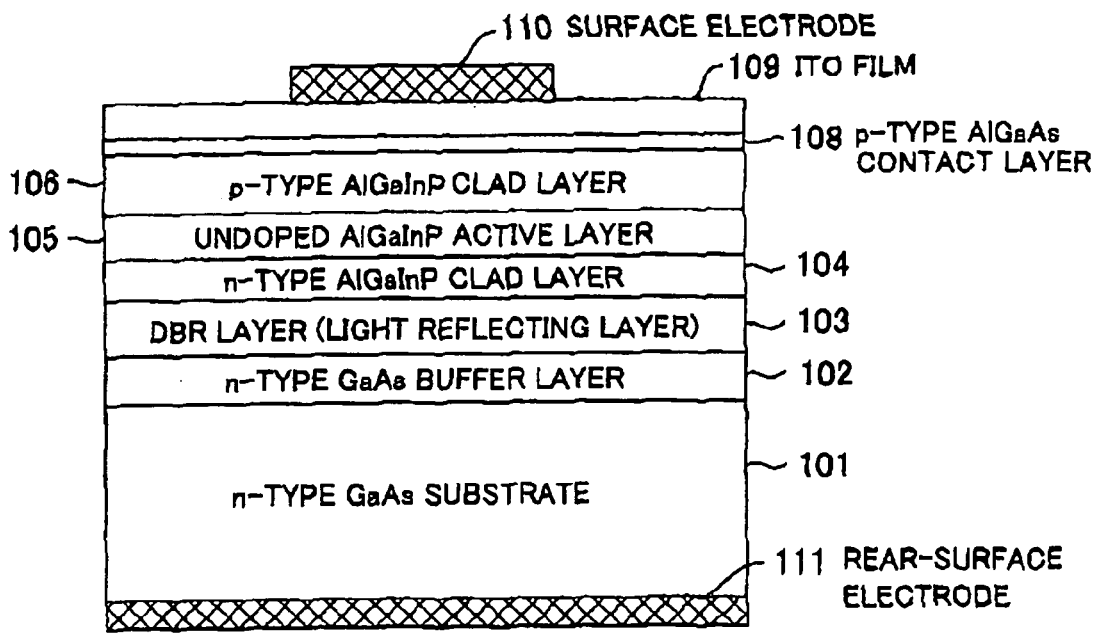
FIG. 23 is a schematic cross sectional view showing an AlGaInP-based red LED in Comparative Example 4.

In Comparative Example 4, a red LED epitaxial wafer with a structure as shown in FIG. 23 and an emission wavelength of about 630 nm is fabricated. Its epitaxial growth method, epitaxial layer thickness, epitaxial layer structure, electrode formation method, and LED device fabrication method are basically the same as those in Comparative Example 3.

However, in Comparative Example 4, the p-type buffer layer 107 is not formed on the p-type clad layer 106, and the contact layer 108 is formed directly on the p-type clad layer 106.

Then, the LED epitaxial wafer thus fabricated is formed into an LED device by the same process as Example 8.

The LED device thus fabricated has initial characteristics, i.e., an optical output of 1.53 mW and an operating voltage of 1.87 V during power feeding at 20 mA (in evaluation).

When the continuous current test is conducted for the devices under the same conditions as Example 8, the LED device has a relative output of 71%.

SIMS analysis is conducted for the LED device just after the formation of the LED device and for the LED device after the continuous current test under the above conditions. As a result, it is confirmed that, in the LED device of Comparative Example 4, the amount Zn diffused in the active layer 105 is as much as Comparative Example 3.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light-emitting device, comprising:
    a light-emitting portion formed on a semiconductor substrate, the light-emitting portion comprising an n-type clad layer, an active layer and a p-type clad layer;
    an As-based contact layer formed on the light-emitting portion, the contact layer being doped with a p-type dopant of $1\times10^{19}$/cm$^3$ or more;
    a current spreading layer formed on the contact layer, the current spreading layer comprising a transparent conductive film of a metal oxide material; and
    a buffer layer formed between the contact layer and the p-type clad layer or formed being inserted inside of the p-type clad layer,
    wherein the buffer layer comprises an undoped group III/V semiconductor, and
    the group III/V semiconductor comprises a group V element comprising P (phosphorus) as a main component thereof.

2. The semiconductor light-emitting device according to claim 1, wherein:
    the buffer layer is lattice-matched to the semiconductor substrate.

3. The semiconductor light-emitting device according to claim 1, wherein:
    an Al composition of the buffer layer is smaller than the p-type clad layer.

4. The semiconductor light-emitting device according to claim 1, further comprising:
    an undoped layer formed between the active layer and the p-type clad layer.

5. The semiconductor light-emitting device according to claim 1, wherein:
    the buffer layer comprises a C-concentration of $1\times10^{17}$ atoms/cm$^3$ or less.

6. The semiconductor light-emitting device according to claim 1, further comprising:
    an undoped layer formed between the n-type clad layer and the active layer.

7. The semiconductor light-emitting device according to claim 1, further comprising:
    an n-type low-doped layer formed between the n-type clad layer and the active layer,
    wherein the n-type low-doped layer comprises a lower carrier density than the n-type clad layer.

8. The semiconductor light-emitting device according to claim 1, wherein:
    the current spreading layer comprises an ITO (indium tin oxide).

9. The semiconductor light-emitting device according to claim 1, wherein:
    the current spreading layer comprises a thickness in a range of ±30% of d calculated by: $d = A \times \lambda_P/(4 \times n)$ where A is a constant of 1 or 3, $\lambda_P$ is an emission wavelength (nm) and n is a refractive index.

10. The semiconductor light-emitting device according to claim 1, wherein:
    the contact layer comprises Zn as a main dopant thereof,
    the contact layer comprises a carrier concentration of $1\times10^{19}$/cm$^3$ or more, and
    the contact layer comprises $Al_XGa_{1-X}As$ where $0 \leq X \leq 0.4$.

11. The semiconductor light-emitting device according to claim 1, wherein:
    the p-type clad layer comprises Mg as a dopant thereof, and
    the n-type clad layer, the active layer and the p-type clad layer comprise $(Al_XGa_{1-X})_YIn_{1-Y}P$ where $0 \leq X \leq 1$ and $0.4 \leq Y \leq 0.6$.

12. The semiconductor light-emitting device according to claim 1, further comprising:
    a light reflecting layer formed between the semiconductor substrate and the n-type clad layer,
    wherein the light reflecting layer comprises a semiconductor multilayer comprising 15 pairs or more of two semiconductor layers that are different in refractive index.

13. The semiconductor light-emitting device according to claim 1, wherein:
    the current spreading layer comprises a carrier concentration of $8\times10^{20}$/cm$^3$ or more.

14. The semiconductor light-emitting device according to claim 1, wherein:
    the active layer comprises a multiquantum well structure or strained multiquantum well structure.

15. The semiconductor light-emitting device according to claim 1, wherein:
    the p-type clad layer and the buffer layer comprise a summed thickness of 1000 nm or more and 3000 nm or less, and
    the p-type clad layer comprises a thickness of 200 nm or more and 600 nm or less.

16. The semiconductor light-emitting device according to claim 1, wherein:
the contact layer comprises a thickness of 1 nm or more and 30 nm or less.

17. The semiconductor light-emitting device according to claim 1, wherein:
the buffer layer comprises an AlInP or AlGaInP that is optically transparent to an emission wavelength.

18. The semiconductor light-emitting device according to claim 12, wherein:
the light reflecting layer comprises a combination of $(Al_XGa_{1-X})_YIn_{1-Y}P$ where $0 \leq X \leq 1$ and $0 \leq Y \leq 0.6$ and $Al_XGa_{1-X}As$ where $0 \leq X \leq 1$.

19. The semiconductor light-emitting device according to claim 1, further comprising:
a p-type low-doped layer formed between the active layer and the p-type clad layer,
wherein the p-type low-doped layer comprises a lower carrier density than the p-type clad layer.

20. The semiconductor light-emitting device according to claim 4, wherein:
the undoped layer comprises a thickness of 100 nm or less.

21. The semiconductor light-emitting device according to claim 6, wherein:
the undoped layer comprises a thickness of 100 nm or less.

22. The semiconductor light-emitting device according to claim 7, wherein:
the n-type low-doped layer comprises a thickness of 100 nm or less.

23. The semiconductor light-emitting device according to claim 19, wherein:
the p-type low-doped layer comprises a thickness of 100 nm or less.

24. The semiconductor light-emitting device according to claim 1, further comprising:
a n-type buffer layer formed on the semiconductor substrate,
wherein the n-type buffer layer comprises a same material as the semiconductor substrate.

25. The semiconductor light-emitting device according to claim 1, wherein:
the buffer layer comprises a lattice-mismatching ratio to a semiconductor layer formed thereunder, and
the lattice-mismatching ratio comprises an absolute value of 0.3% or less.

26. The semiconductor light-emitting device according to claim 1, wherein:
the buffer layer comprises a GaP.

27. A semiconductor light-emitting device, comprising:
a light-emitting portion formed on a semiconductor substrate, the light-emitting portion comprising an n-type clad layer, an active layer and a p-type clad layer;
an As-based contact layer formed on the light-emitting portion, the contact layer being doped with a p-type dopant of $1 \times 10^{19}/cm^3$ or more;
a current spreading layer formed on the contact layer, the current spreading layer comprising a transparent conductive film of a metal oxide material; and
a buffer layer formed between the contact layer and the p-type clad layer or formed being inserted inside of the p-type clad layer,
wherein the buffer layer comprises an undoped group III/V semiconductor,
the group III/V semiconductor comprises a group V element comprising P (phosphorus), and
the group III/V semiconductor comprises an H-concentration of $3 \times 10^{17}$ atoms/cm$^3$ or less.

28. The semiconductor light-emitting device according to claim 27, wherein:
the buffer layer is lattice-matched to the semiconductor substrate, and
the buffer layer comprises the group III/V semiconductor with a higher resistivity than the p-type clad layer.

29. The semiconductor light-emitting device according to claim 27, wherein:
an Al composition of the buffer layer is smaller than the p-type clad layer.

30. The semiconductor light-emitting device according to claim 27, further comprising:
an undoped layer formed between the active layer and the p-type clad layer.

31. The semiconductor light-emitting device according to claim 27, wherein:
the buffer layer comprises a C-concentration of $5 \times 10^{16}$ atoms/cm$^3$ or less.

32. The semiconductor light-emitting device according to claim 27, further comprising:
an undoped layer formed between the n-type clad layer and the active layer.

33. The semiconductor light-emitting device according to claim 27, further comprising:
an n-type low-doped layer formed between the n-type clad layer and the active layer,
wherein the n-type low-doped layer comprises a semiconductor comprising a n-type conductivity-determining impurity with a lower concentration than the n-type clad layer.

34. The semiconductor light-emitting device according to claim 27, wherein:
the current spreading layer comprises an ITO (indium tin oxide).

35. The semiconductor light-emitting device according to claim 27, wherein:
the current spreading layer comprises a thickness in a range of ±30% of d calculated by: $d = A \times \lambda_P/(4 \times n)$ where A is a constant of 1 or 3, $\lambda_P$ is an emission wavelength (nm) and n is a refractive index.

36. The semiconductor light-emitting device according to claim 27, wherein:
the contact layer comprises Zn as a dopant thereof,
the contact layer comprises a carrier concentration of $1 \times 10^{19}/cm^3$ or more, and
the contact layer comprises $Al_XGa_{1-X}As$ where $0 \leq X \leq 0.4$.

37. The semiconductor light-emitting device according to claim 27, wherein:
the p-type clad layer comprises Mg as a dopant thereof, and
the n-type clad layer, the active layer and the p-type clad layer comprise $(Al_XGa_{1-X})_YIn_{1-Y}P$ where $0 \leq X \leq 1$ and $0.4 \leq Y \leq 0.6$.

38. The semiconductor light-emitting device according to claim 27, further comprising:
a light reflecting layer formed between the semiconductor substrate and the n-type clad layer,
wherein the light reflecting layer comprises a semiconductor multilayer comprising 10 pairs or more of two semiconductor layers that are different in refractive index.

39. The semiconductor light-emitting device according to claim 27, wherein:
the current spreading layer comprises a carrier concentration of $8 \times 10^{20}/cm^3$ or more.

40. The semiconductor light-emitting device according to claim 27, wherein:
the active layer comprises a multiquantum well structure or strained multiquantum well structure.

41. The semiconductor light-emitting device according to claim 27, wherein:

the p-type clad layer and the buffer layer comprise a summed thickness of 1000 nm or more and 3000 nm or less, and the p-type clad layer comprises a thickness of 200 nm or more and 1000 nm or less.

42. The semiconductor light-emitting device according to claim 27, wherein:

the contact layer comprises a thickness of 1 nm or more and 30 nm or less.

43. The semiconductor light-emitting device according to claim 27, wherein:

the buffer layer comprises an AlInP or AlGaInP that is optically transparent to an emission wavelength.

44. The semiconductor light-emitting device according to claim 38, wherein:

the light reflecting layer comprises a combination of $(Al_XGa_{1-X})_YIn_{1-Y}P$ where $0 \leq X \leq 1$ and $0 \leq Y \leq 0.6$ and $Al_XGa_{1-X}As$ where $0 \leq X \leq 1$.

45. The semiconductor light-emitting device according to claim 27, further comprising:

a p-type low-doped layer formed between the active layer and the p-type clad layer, wherein the p-type low-doped layer comprises a semiconductor comprising a p-type conductivity-determining impurity with a lower concentration than the p-type clad layer.

46. The semiconductor light-emitting device according to claim 30, wherein:

the undoped layer comprises a thickness of 100 nm or less.

47. The semiconductor light-emitting device according to claim 32, wherein:

the undoped layer comprises a thickness of 100 nm or less.

48. The semiconductor light-emitting device according to claim 33, wherein:

the n-type low-doped layer comprises a thickness of 100 nm or less.

49. The semiconductor light-emitting device according to claim 45, wherein:

the p-type low-doped layer comprises a thickness of 100 nm or less.

50. The semiconductor light-emitting device according to claim 27, further comprising:

a n-type buffer layer formed on the semiconductor substrate, wherein the n-type buffer layer comprises a same material as the semiconductor substrate.

51. The semiconductor light-emitting device according to claim 27, wherein:

the buffer layer comprises a lattice-mismatching ratio to a semiconductor layer formed thereunder, and the lattice-mismatching ratio comprises an absolute value of 0.3% or less.

52. The semiconductor light-emitting device according to claim 27, wherein:

the buffer layer comprises a GaP.

* * * * *